(12) United States Patent
Hieno et al.

(10) Patent No.: US 9,659,816 B2
(45) Date of Patent: May 23, 2017

(54) PATTERN FORMING METHOD

(71) Applicant: Kabushiki Kaisha Toshiba, Minato-ku (JP)

(72) Inventors: Atsushi Hieno, Yokohama (JP); Koji Asakawa, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/065,129

(22) Filed: Mar. 9, 2016

(65) Prior Publication Data

US 2016/0284560 A1 Sep. 29, 2016

(30) Foreign Application Priority Data

Mar. 24, 2015 (JP) ................. 2015-061796

(51) Int. Cl.
*G03F 7/004* (2006.01)
*G03F 7/40* (2006.01)
(Continued)

(52) U.S. Cl.
CPC .... *H01L 21/76879* (2013.01); *B81C 1/00031* (2013.01); *B82Y 30/00* (2013.01); *B82Y 40/00* (2013.01); *G03F 7/002* (2013.01); *G03F 7/0035* (2013.01); *G03F 7/165* (2013.01); *G03F 7/20* (2013.01); *H01L 21/0271* (2013.01); *H01L 21/0275* (2013.01); *H01L 21/02118* (2013.01);
(Continued)

(58) Field of Classification Search
CPC .......... G03F 7/002; G03F 7/20; G03F 7/0035; G03F 7/165; H01L 21/31144; H01L 21/0275; H01L 21/31138; H01L 21/02118; H01L 21/30604; B82Y 40/00; B82Y 30/00; B81C 1/00031; B81C 2201/0149
USPC ....... 430/312, 313, 314, 322, 325, 329, 330, 430/331; 438/703, 761; 216/41, 49, 67
See application file for complete search history.

(56) References Cited

U.S. PATENT DOCUMENTS

2007/0277866 A1 12/2007 Sander et al.
2008/0299774 A1* 12/2008 Sandhu ............... H01L 21/0337
438/696
(Continued)

FOREIGN PATENT DOCUMENTS

JP  2001-100419  4/2001
JP  2009-260330  11/2009
(Continued)

OTHER PUBLICATIONS

Qing Peng, et al., "Nanoscopic Patterned Materials with Tunable Dimensions via Atomic Layer Deposition on Block Copolymers", Advanced Materials, 2010, (22), 5 pgs.

*Primary Examiner* — Amanda C Walke
(74) *Attorney, Agent, or Firm* — Oblon, McClelland, Maier & Neustadt, L.L.P.

(57) ABSTRACT

A pattern forming method in an embodiment includes forming, on or above a substrate, a block copolymer layer containing a first polymer and a second polymer having lower surface energy than the first polymer, heat treating the block copolymer layer to separate the block copolymer layer into a first phase containing the first polymer and a second phase containing the second polymer, and using an atomic layer deposition process, selectively forming a metal layer on the first phase and selectively removing the second phase.

16 Claims, 24 Drawing Sheets

(51) Int. Cl.

| | | |
|---|---|---|
| *H01L 21/768* | (2006.01) | |
| *G03F 7/20* | (2006.01) | |
| *G03F 7/00* | (2006.01) | |
| *H01L 21/027* | (2006.01) | |
| *G03F 7/16* | (2006.01) | |
| *H01L 21/311* | (2006.01) | |
| *B81C 1/00* | (2006.01) | |
| *B82Y 40/00* | (2011.01) | |
| *B82Y 30/00* | (2011.01) | |
| *H01L 21/306* | (2006.01) | |
| *H01L 21/02* | (2006.01) | |
| *H01L 21/033* | (2006.01) | |

(52) U.S. Cl.
CPC .... *H01L 21/0337* (2013.01); *H01L 21/30604* (2013.01); *H01L 21/31138* (2013.01); *H01L 21/31144* (2013.01); *H01L 21/76816* (2013.01); *B81C 2201/0149* (2013.01)

(56) References Cited

U.S. PATENT DOCUMENTS

| | | | |
|---|---|---|---|
| 2009/0251845 A1 | 10/2009 | Kiehlbauch | |
| 2012/0107583 A1* | 5/2012 | Xiao | G03F 7/0002 428/210 |
| 2013/0078570 A1 | 3/2013 | Hieno et al. | |
| 2013/0183827 A1* | 7/2013 | Millward | H01L 21/0273 438/694 |
| 2013/0209755 A1 | 8/2013 | Hustad et al. | |
| 2013/0309457 A1 | 11/2013 | Rathsack et al. | |
| 2014/0127910 A1 | 5/2014 | Hieno et al. | |
| 2014/0322917 A1* | 10/2014 | Abdallah | H01L 21/3081 438/703 |
| 2015/0118625 A1* | 4/2015 | Yang | B82Y 10/00 430/296 |
| 2015/0175642 A1* | 6/2015 | Sakurai | C07C 251/08 427/250 |
| 2015/0217330 A1* | 8/2015 | Haukka | B05D 3/107 427/343 |
| 2015/0261092 A1 | 9/2015 | Hieno et al. | |

FOREIGN PATENT DOCUMENTS

| | | |
|---|---|---|
| JP | 2009-539261 | 11/2009 |
| JP | 2011-517089 | 5/2011 |
| JP | 2013-72896 | 4/2013 |
| JP | 2013-166934 | 8/2013 |
| JP | 2014-96407 | 5/2014 |

* cited by examiner

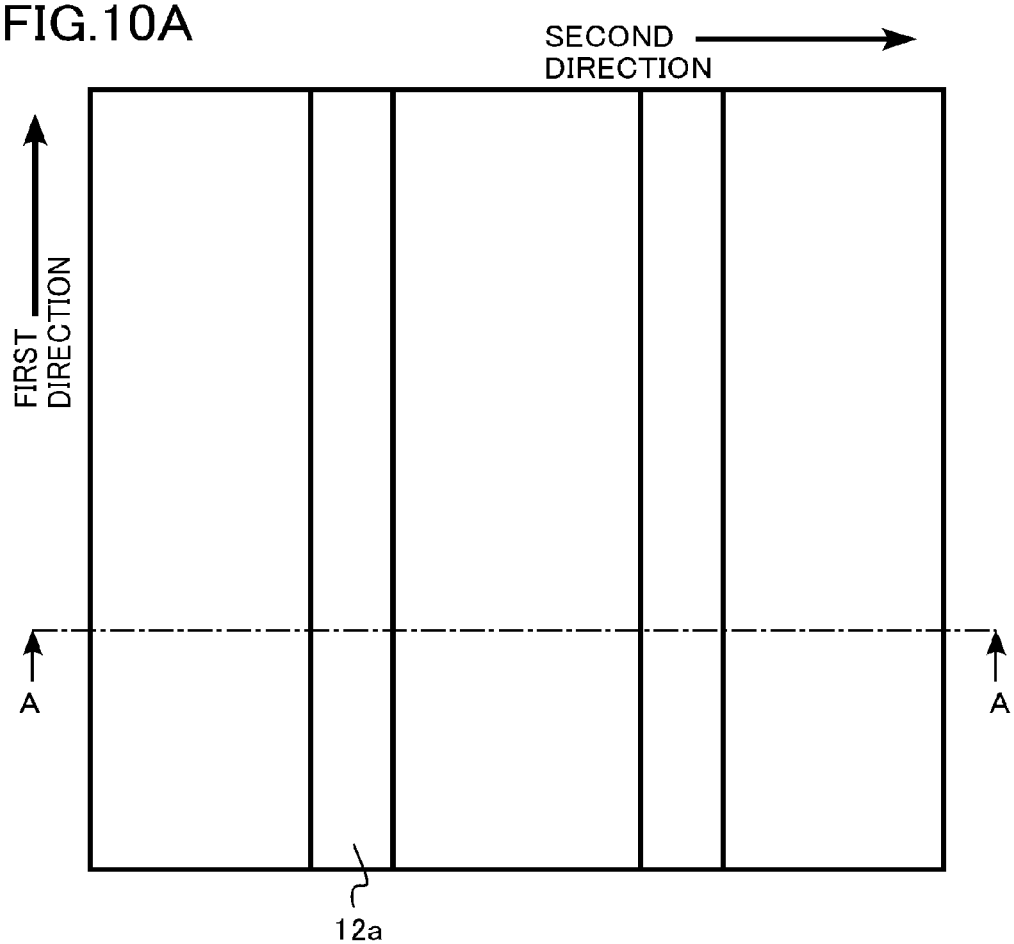
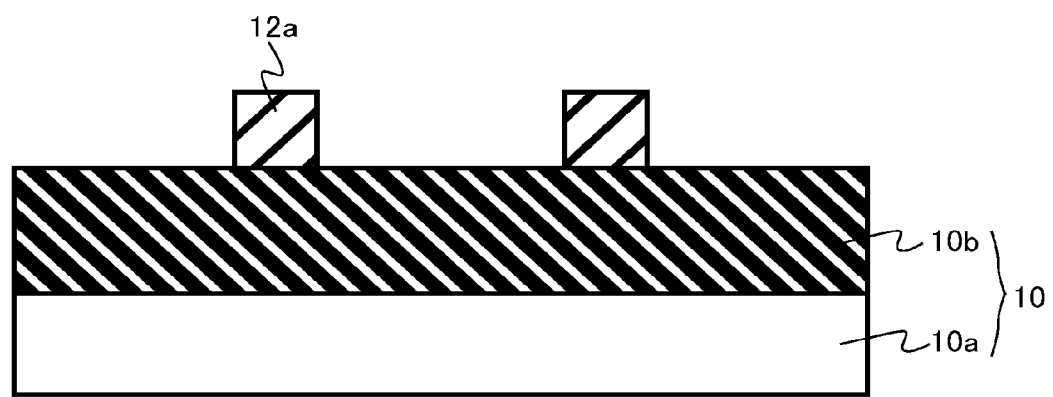

PATTERN FORMING METHOD

CROSS-REFERENCE TO RELATED APPLICATION

This application is based upon and claims the benefit of priority from Japanese Patent Application No. 2015-061796, filed on Mar. 24, 2015, the entire contents of which are incorporated herein by reference.

FIELD

Embodiments described herein relate generally to pattern forming methods.

BACKGROUND

One of the methods for forming wiring or contact hole patterns of semiconductor devices is pattern forming methods using block copolymers. For example, it is possible to use a pattern formed by a conventional optical lithography technique as a guide layer and forma regular pattern of smaller dimensions using phase separation of a block copolymer. This technique is called a directed self-assembly (DSA) technique.

However, polymer patterns formed by a DSA technique do not have sufficient dry etching resistance. Thus, for dry etching processing with a polymer pattern formed by a DSA technique as a mask, there is a method of selectively forming a protective film such as an oxide previously on the pattern. In this case, although dry etching resistance is improved, a process step of forming a protective film is additionally required. The additional process step makes a manufacturing process complicated and expensive.

BRIEF DESCRIPTION OF THE DRAWINGS

FIGS. 10A, 10B are schematic views illustrating a pattern forming method in a third embodiment;

DETAILED DESCRIPTION

Figure 1A:
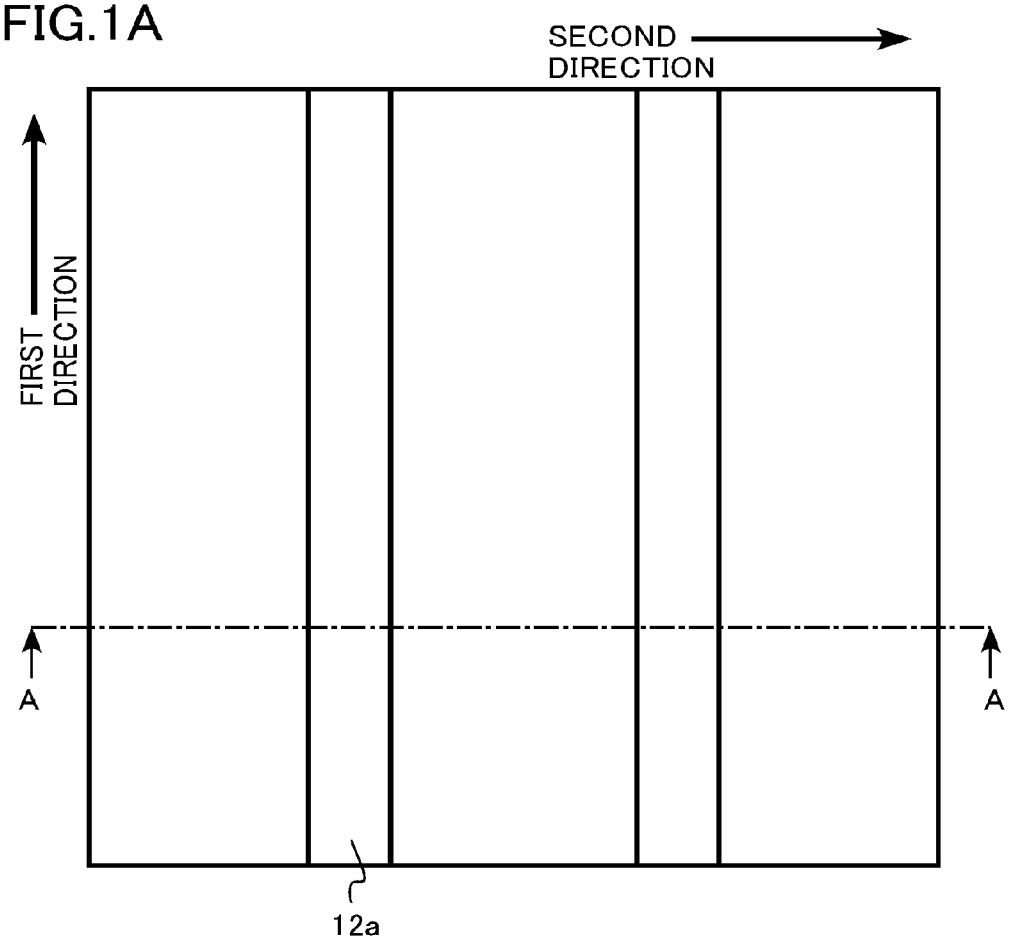
FIGS. 1A, 1B are schematic views illustrating a pattern forming method in a first embodiment.

A pattern forming method in an embodiment includes forming a block copolymer layer on or above a substrate, the block copolymer layer containing a first polymer and a second polymer, the second polymer having lower surface energy than the first polymer, heat treating the block copolymer layer to separate the block copolymer layer into a first phase containing the first polymer and a second phase containing the second polymer, and forming selectively a metal layer on the first phase and removing selectively the second phase using an atomic layer deposition process.

In the description, the same or similar members are denoted by the same reference numerals, and redundant descriptions may be omitted.

In the description, the words "top" and "lower" are used to describe relative positional relationships between components or others. In the description, the words "top" and "lower" do not necessarily conceptually mean a relationship with the direction of gravity.

Hereinafter, embodiments will be described with reference to the drawings.

(First Embodiment)

A pattern forming method in this embodiment includes forming, on a substrate, a block copolymer layer containing a first polymer and a second polymer having lower surface energy than the first polymer, heat treating the block copolymer layer to separate the block copolymer layer into a first phase containing the first polymer and a second phase containing the second polymer, and using an atomic layer deposition process, selectively forming a metal layer on the first phase and selectively removing the second phase.

The pattern forming method in this embodiment further includes, before forming the block copolymer layer, forming, on the substrate, a guide layer in which a first region extending in a first direction and a second region having lower surface energy than the first region and extending in the first direction are alternately arranged, forming the block copolymer layer on the guide layer, and by the heat treatment, phase-separating the block copolymer layer so that the first phase extending in the first direction and the second phase extending in the first direction are alternately arranged.

The pattern forming method in this embodiment further includes forming an insulator layer in a region from which the second phase is removed.

A DSA technique is applied to the pattern forming method in this embodiment.

FIGS. 1A, 1B to FIGS. 6A, 6B are schematic views illustrating the pattern forming method in this embodiment. FIGS. 1A to 6A are top views, and FIGS. 1B to 6B are cross-sectional views along AA in FIGS. 1A to 6A.

Figure 1B:
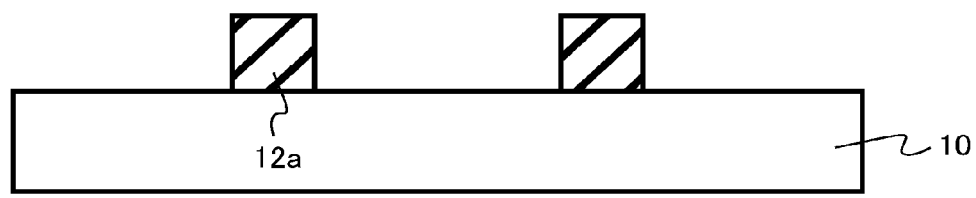

First, a plurality of first regions 12a extending in a first direction is formed on a substrate 10 (FIGS. 1A, 1B). The first regions 12a are formed, for example, through application of an organic material film by a spin coat process, an optical lithography process, and a reactive ion etching (RIE) process. The substrate 10 is, for example, a semiconductor substrate such as a single crystal silicon substrate. The first regions 12a are, for example, poly(4-hydroxystyrene) (PHS—OH), poly(2-vinylpyridine) (P2VP—OH), polyacrylamide (PAAm—OH), or poly(methacrylic acid) (PMAc—OH), all of which have an OH group at one end of a polymer chain.

Figure 2A:
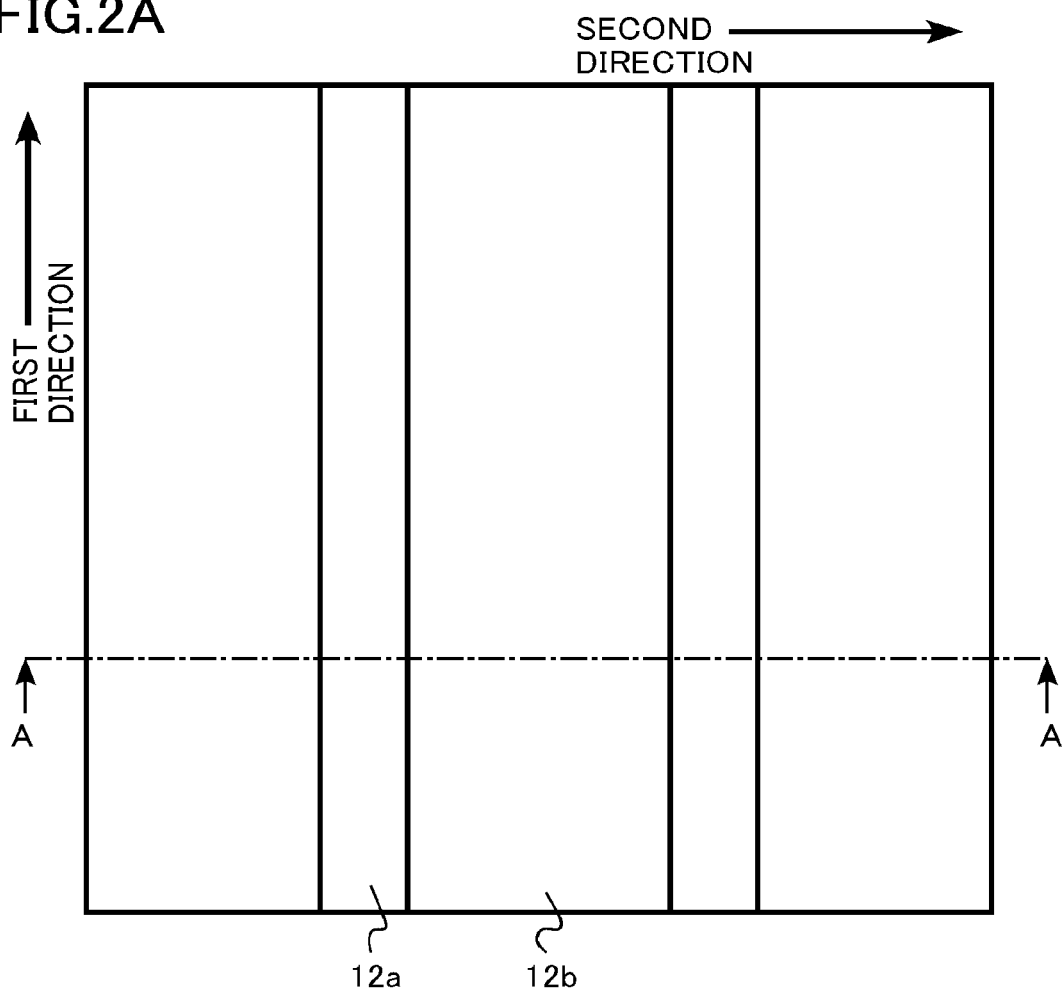
FIGS. 2A, 2B are schematic views illustrating the pattern forming method in the first embodiment.
Figure 2B:
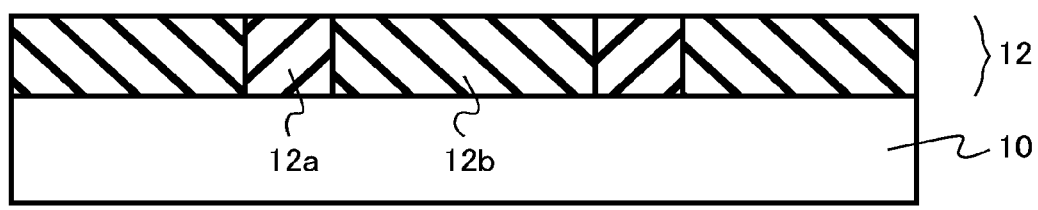

Next, second regions 12b extending in the first direction are formed on surfaces of the substrate 10 exposed between the first regions 12a (FIGS. 2A, 2B). The second regions 12b have lower surface energy than the first regions 12a. In other words, the first regions 12a have a higher degree of hydrophilicity than the second regions 12b. To be precise, the second regions 12b have a substantially middle surface energy value between those of a first polymer and a second polymer of a block copolymer layer 14 formed later.

The second regions 12b are formed, for example, through application of an applied organic material film by a spin coat process and removal of excess portions. The second regions 12b are, for example, a poly(4-hydroxystyrene)-poly(methyl methacrylate) random copolymer (PHS-r-PMMA-OH), a polystyrene-poly(2-vinylpyridine) random copolymer (PS-r-P2VP—OH), a poly(4-hydroxystyrene)-poly(methyl acrylate) random copolymer (PHS-r-PMA—OH), a polyacrylamide-poly(methyl methacrylate) random copolymer (PAAm-r-PMMA-OH), a poly(methacrylic acid)-poly(methyl methacrylate) random copolymer (PMAc-r-PMMA-OH), or a polyacrylamide-poly(methyl acrylate) random copolymer (PAAm-r-PMA—OH), all of which have an OH group at one end of a polymer chain.

The alternately arranged first regions 12a and second regions 12b constitute a guide layer 12. At the surface of the guide layer 12, the first regions 12a of relatively high surface energy and the second regions 12b of relatively low surface energy are arranged alternately.

Alternatively, by changing the organic material film to one having photosensitivity, the guide layer 12 may be formed by irradiating regions corresponding to the first regions 12a or the second regions 12b with light through an optical lithography process for surface modification. The irradiation with light enables formation of a structure in which the first regions 12a of relatively high surface energy and the second regions 12b of relatively low surface energy are arranged alternately.

Figure 3A:
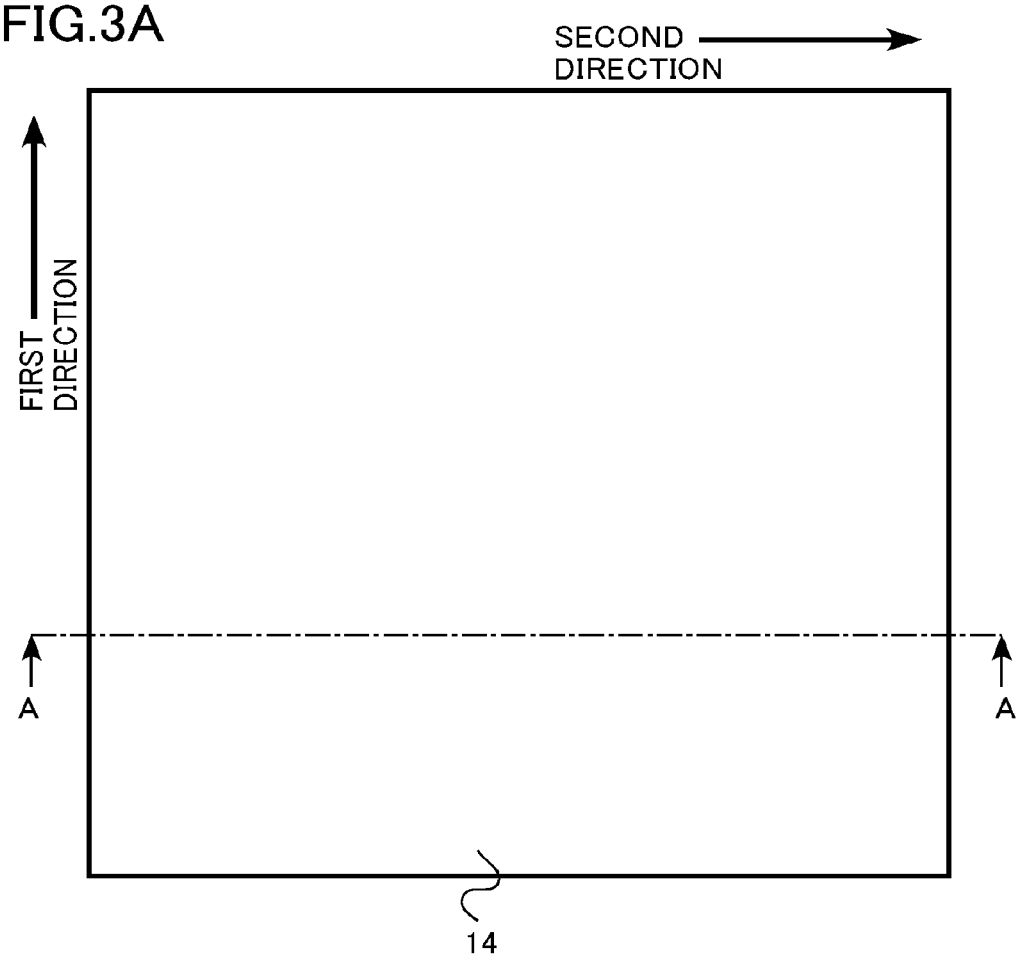
FIGS. 3A, 3B are schematic views illustrating the pattern forming method in the first embodiment.
Figure 3B:
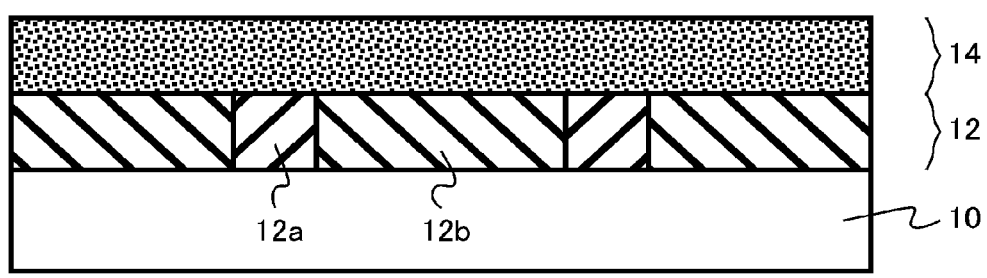

Next, the block copolymer layer 14 is formed on the guide layer 12 (FIGS. 3A, 3B). The block copolymer layer 14 contains the first polymer and the second polymer having lower surface energy than the first polymer. The first polymer has a higher degree of hydrophilicity than the second polymer. The block copolymer layer 14 is formed, for example, by application through a spin coat process.

It is preferred that the first polymer contain, at a side chain, a functional group selected from the group of a hydroxyl group, a carboxyl group, an amino group, an amide group, an isocyanate group, and a pyridine ring, and the second polymer not contain, at a side chain, a functional group selected from the group of a hydroxyl group, a carboxyl group, an amino group, an amide group, an isocyanate group, and a pyridine ring.

The block copolymer layer 14 preferably includes one of the combinations of a polystyrene derivative and a polymethacrylate derivative, a polystyrene derivative and a polyacrylate derivative, a polymethacrylate derivative and a polyacrylate derivative, a polystyrene derivative and a polystyrene derivative, a polymethacrylate derivative and a polymethacrylate derivative, and a polyacrylate derivative and a polyacrylate derivative, in terms of facilitating synthesis.

The first polymer is, for example, poly(4-hydroxystyrene) (PHS), poly(2-hydroxyethyl methacrylate) (PHEMA), poly (2-vinylpyridine) (P2VP), poly(acrylic acid) (PAA), polyacrylamide (PAAm), or poly(methacrylic acid) (PMAc). The second polymer is, for example, poly(hexyl methacrylate) (PHMA), polystyrene (PS), poly(methyl methacrylate) (PMMA), poly(methyl acrylate) (PMA), poly(tert-butyl methacrylate) (PtBMA), or poly(tert-butyl acrylate) (PtBA).

The block copolymer layer 14 is, for example, a poly(4-hydroxystyrene)-poly(methyl methacrylate) block copolymer (PHS-b-PMMA), a polystyrene-poly(2-vinylpyridine) block copolymer (PS-b-P2VP), a poly(4-hydroxystyrene)-poly(methyl acrylate) block copolymer (PHS-b-PMA), a polyacrylamide-poly(methyl methacrylate) block copolymer (PAAm-b-PMMA), a poly(methacrylic acid)-poly (methyl methacrylate) block copolymer (PMAc-b-PMMA), or a polyacrylamide-poly(methyl acrylate) block copolymer (PAAm-b-PMA). In this case, the first polymer is PHS, P2VP, PAAm, or PMAc, and the second polymer is PMMA, PS, or PMA.

Figure 4A:
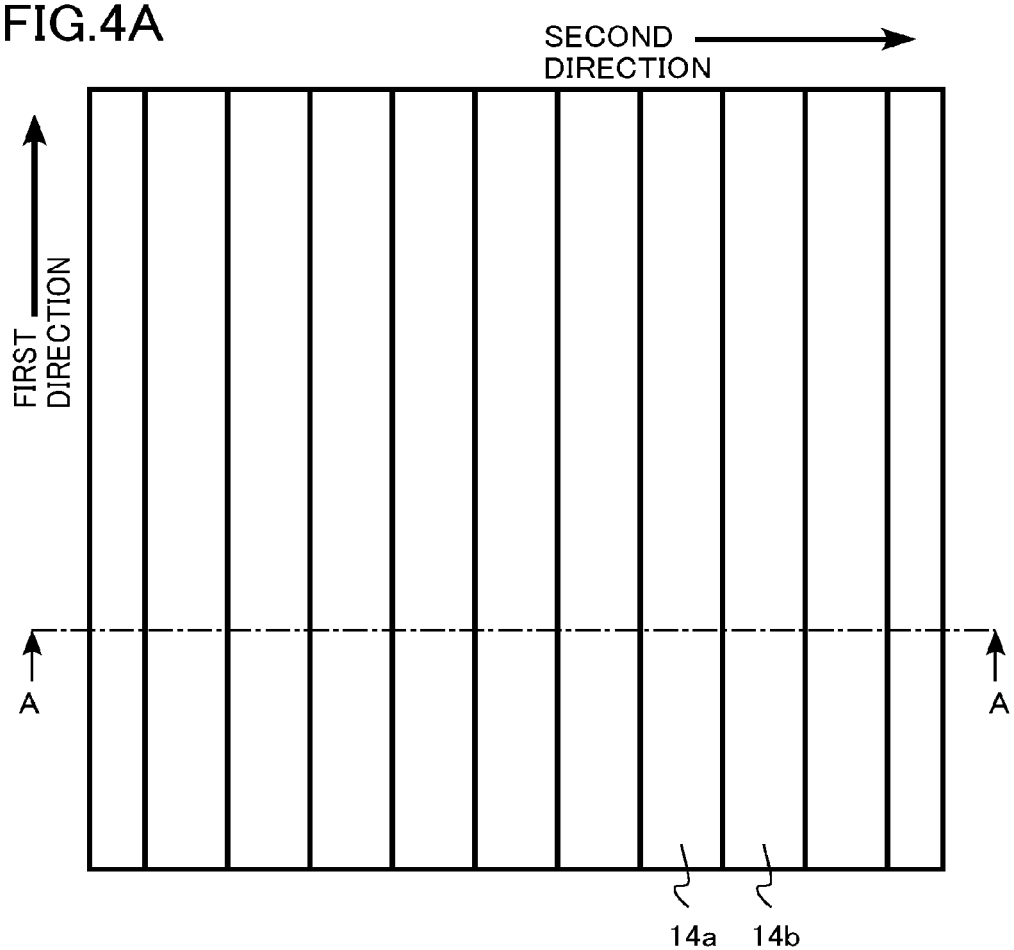
FIGS. 4A, 4B are schematic views illustrating the pattern forming method in the first embodiment.
Figure 4B:
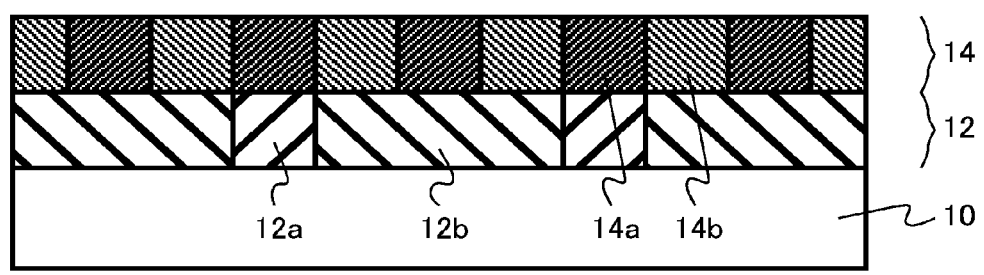

Next, the block copolymer layer 14 is heat-treated to be phase-separated into a first phase 14a and a second phase 14b (FIGS. 4A, 4B). The first phase 14a contains the first polymer and extends in the first direction. The second phase 14b contains the second polymer and extends in the first direction. Due to the separation, the first phase 14a and the second phase 14b are arranged alternately.

In terms of stable separation between the first phase 14a and the second phase 14b, it is preferred that the first polymer have larger surface energy than the second regions 12b, and the second polymer have smaller surface energy than the second regions 12b. In terms of stable separation between the first phase 14a and the second phase 14b, it is more preferred that the first regions 12a have surface energy close to that of the first polymer, and the second regions 12b have substantially middle surface energy between those of the first polymer and the second polymer. In terms of stable separation between the first phase 14a and the second phase 14b, it is even more preferred that the first regions 12a have surface energy substantially equal to that of the first polymer.

Figure 5A:
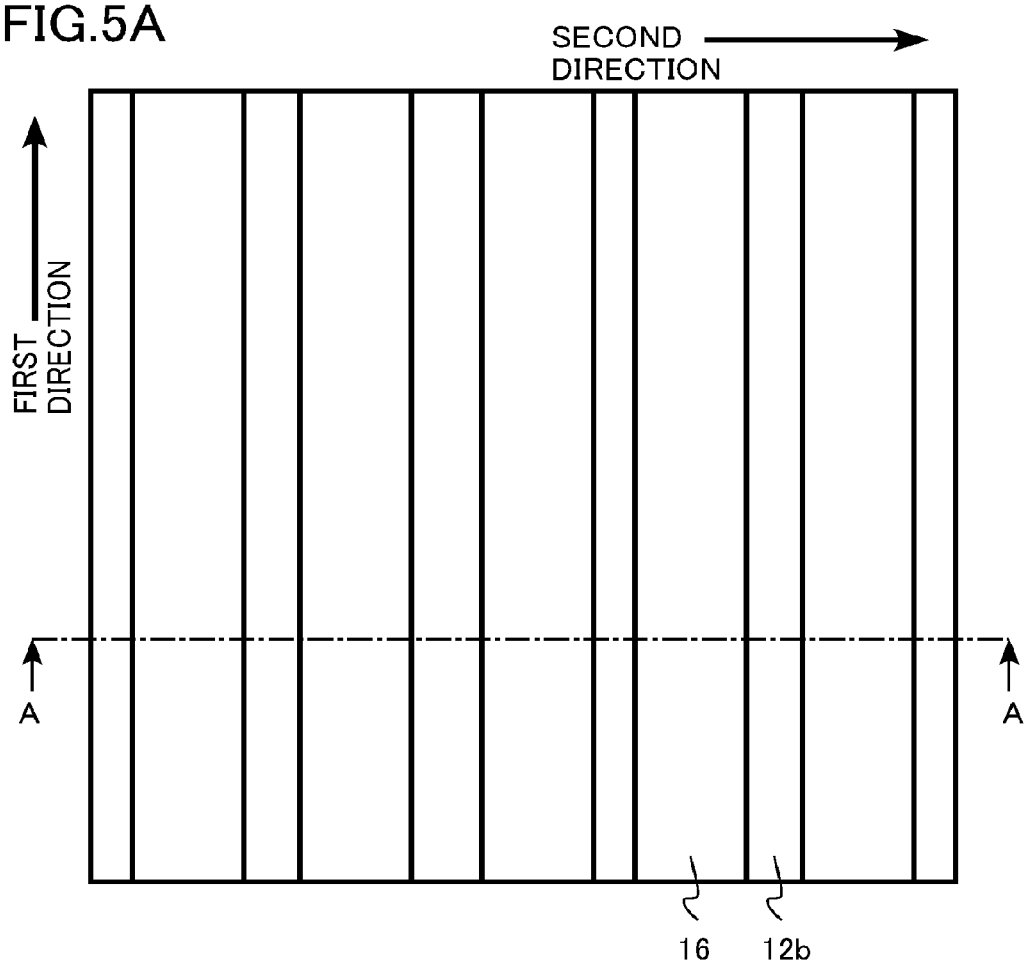
FIGS. 5A, 5B are schematic views illustrating the pattern forming method in the first embodiment.
Figure 5B:
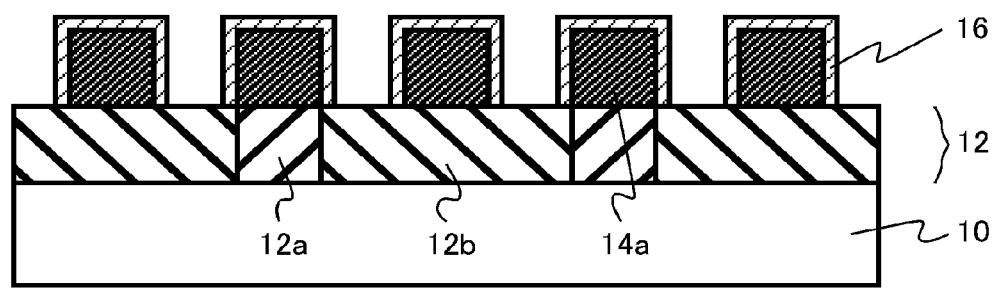

Next, using an atomic layer deposition (ALD) process, a metal layer 16 is selectively formed on the first phase 14a, and the second phase 14b is selectively removed (FIGS. 5A, 5B). Selective growth of the metal layer 16 onto the first phase 14a and etching of the second phase 14b are performed simultaneously in the same processing by the ALD process.

The metal layer 16 is, for example, nickel (Ni), tungsten (W), molybdenum (Mo), gold (Au), silver (Ag), or copper (Cu).

When the first polymer has a hydroxyl group (—OH), for example, the first phase 14a containing the first polymer resists being etched because the metal layer 16 is selectively deposited on its surface. On the other hand, when the second polymer does not have a hydroxyl group, the second phase 14b containing the second polymer is exposed to ozone in an oxidant or plasma to be easily etched and selectively removed because the metal layer 16 is not deposited on its surface.

In terms of improving selectivity in the removal of the second phase 14b, the ALD process preferably uses ozone and hydrogen as a gas for film formation. Alternatively, in terms of improving selectivity in the removal of the second phase 14b, the ALD process preferably uses hydrogen plasma.

Figure 6A:
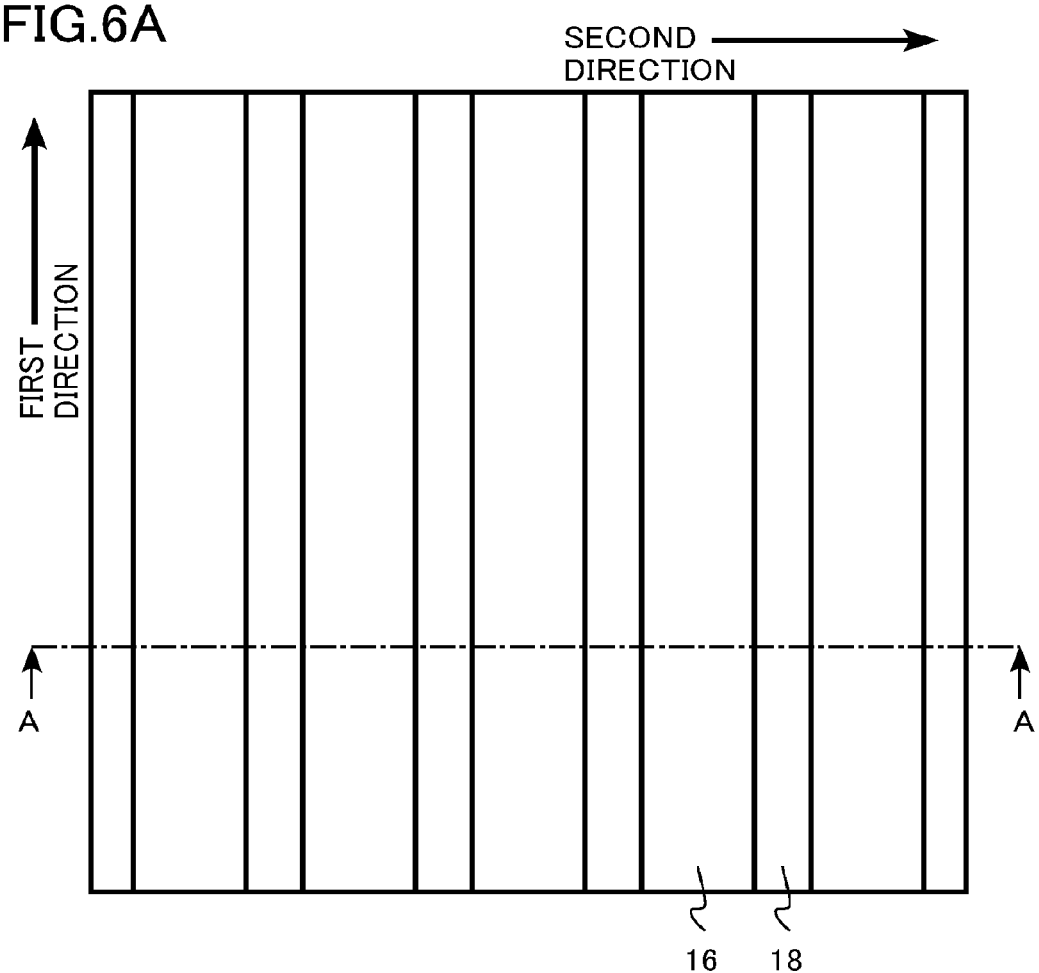
FIGS. 6A, 6B are schematic views illustrating the pattern forming method in the first embodiment.
Figure 6B:
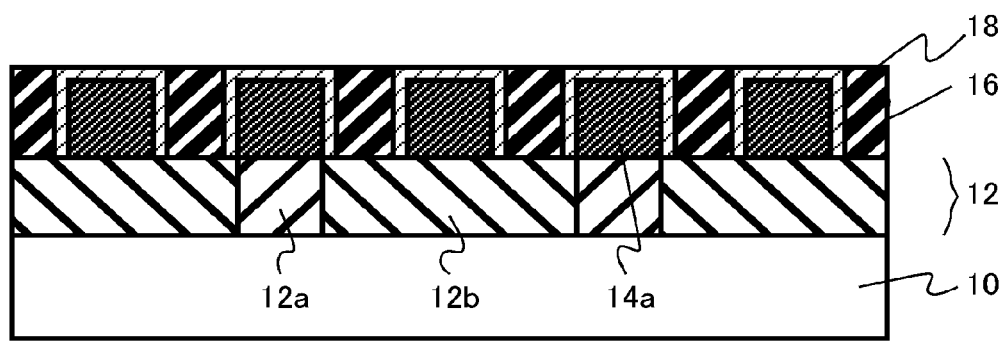

Next, an insulator layer 18 is formed in regions from which the second phase 14b is removed (FIGS. 6A, 6B). The insulator layer 18 is, for example, an oxide. The insulator layer 18 is, for example, silicon oxide, silicon nitride, or silicon oxynitride.

The insulator layer 18 is deposited by a chemical vapor deposition (CVD) process, for example. Thereafter, it is planarized by a chemical mechanical polishing (CMP) process, for example.

By the above pattern forming method, the fine metal layer 16 extending in the first direction can be formed.

The following describes the function and effect of the pattern forming method in this embodiment.

In this embodiment, the metal layer 16 is formed using a block copolymer as a self-assembled material. At that time, using an ALD process, the metal layer 16 is selectively formed on one phase (the first phase 14a) of the phase-separated block copolymer, and the other phase (the second phase 14b) is selectively removed.

For example, suppose that when an ALD process is performed, a precursor for metal film formation, ozone, and hydrogen are supplied. The addition of hydrogen inhibits generation of a metal oxide film. Then, suppose that the first polymer constituting the first phase 14a has a hydrophilic group such as a hydroxyl group, and the second polymer constituting the second phase 14b does not have a hydrophilic group such as a hydroxyl group.

In this case, the precursor is chemically adsorbed selectively on hydrophilic groups in the first phase 14a. On the other hand, the second phase 14b is hydrophobic so that the precursor is hardly adsorbed thereon, and is exposed to ozone to be oxidized, and etching proceeds. This phenomenon occurs likewise by a combination of a precursor for metal film formation and hydrogen plasma.

In this embodiment, the formation of the metal layer 16 and the patterning are simultaneously performed by the ALD process. Thus, using a line pattern of a minute design rule formed using phase separation of a block copolymer, the metal layer 16 can be formed without performing etching of metal.

This can reduce complicated steps and high-cost steps for forming the metal layer 16. Thus, the manufacturing process can be simplified and reduced in cost. Accordingly, low-cost minute semiconductor devices and the like can be manufactured.

In terms of improving selectivity in the formation of the metal layer 16 onto the first phase 14a and selectivity in the removal of the second phase 14b, it is preferred that the first polymer contain, at a side chain, a functional group selected from the group of a hydroxyl group, a carboxyl group, an amino group, an amide group, an isocyanate group, and a pyridine ring, and the second polymer not contain, at a side chain, a functional group selected from the group of a hydroxyl group, a carboxyl group, an amino group, an amide group, an isocyanate group, and a pyridine ring.

According to this embodiment above, a pattern forming method with a simple manufacturing process using a DSA technique can be provided.

(Second Embodiment)

A pattern forming method in this embodiment includes forming, on a substrate, a block copolymer layer containing a first polymer and a second polymer having lower surface energy than the first polymer, heat treating the block copolymer layer to phase-separate the block copolymer layer into a first phase containing the first polymer and a second phase containing the second polymer, and using an atomic layer deposition process, selectively forming an oxide layer on the first phase and selectively removing the second phase.

The pattern forming method in this embodiment further includes, before forming the block copolymer layer, forming, on the substrate, a guide layer in which a first region extending in a first direction and a second region having lower surface energy than the first region and extending in the first direction are alternately arranged, forming the block copolymer layer on the guide layer, and by the heat treatment, phase-separating the block copolymer layer so that the first phase extending in the first direction and the second phase extending in the first direction are alternately arranged.

The pattern forming method in this embodiment further includes forming a metal layer in a region from which the second phase is removed.

A DSA technique is applied to the pattern forming method in this embodiment.

FIGS. 7A, 7B to FIGS. 9A, 9B are schematic views illustrating a pattern forming method in this embodiment. FIGS. 7A to 9A are top views, and FIGS. 7B to 9B are cross-sectional views along AA in FIGS. 7A to 9A.

Figure 7A:
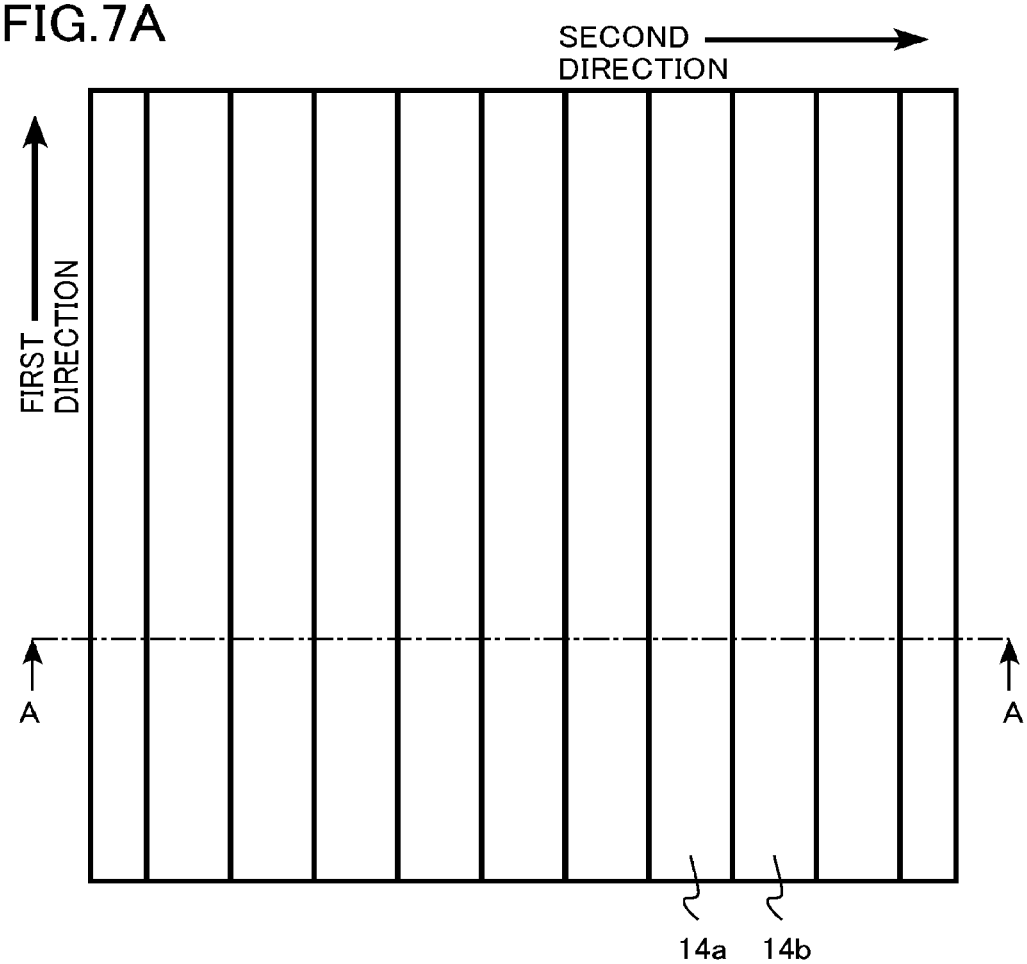
FIGS. 7A, 7B are schematic views illustrating a pattern forming method in a second embodiment.
Figure 7B:
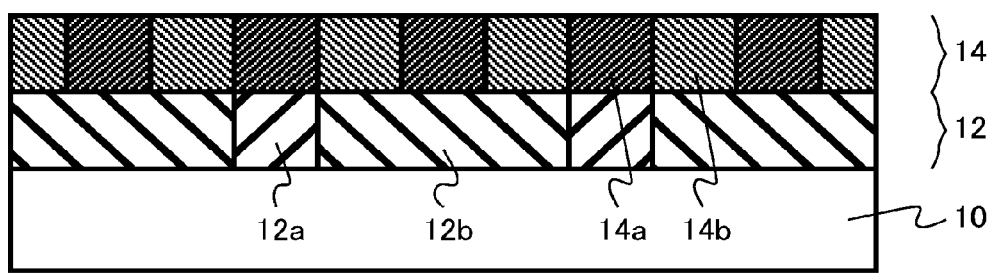

This embodiment is identical to the first embodiment until a block copolymer layer 14 is heat-treated and phase-separated into a first phase 14a and a second phase 14b (FIGS. 7A, 7B).

Figure 8A:
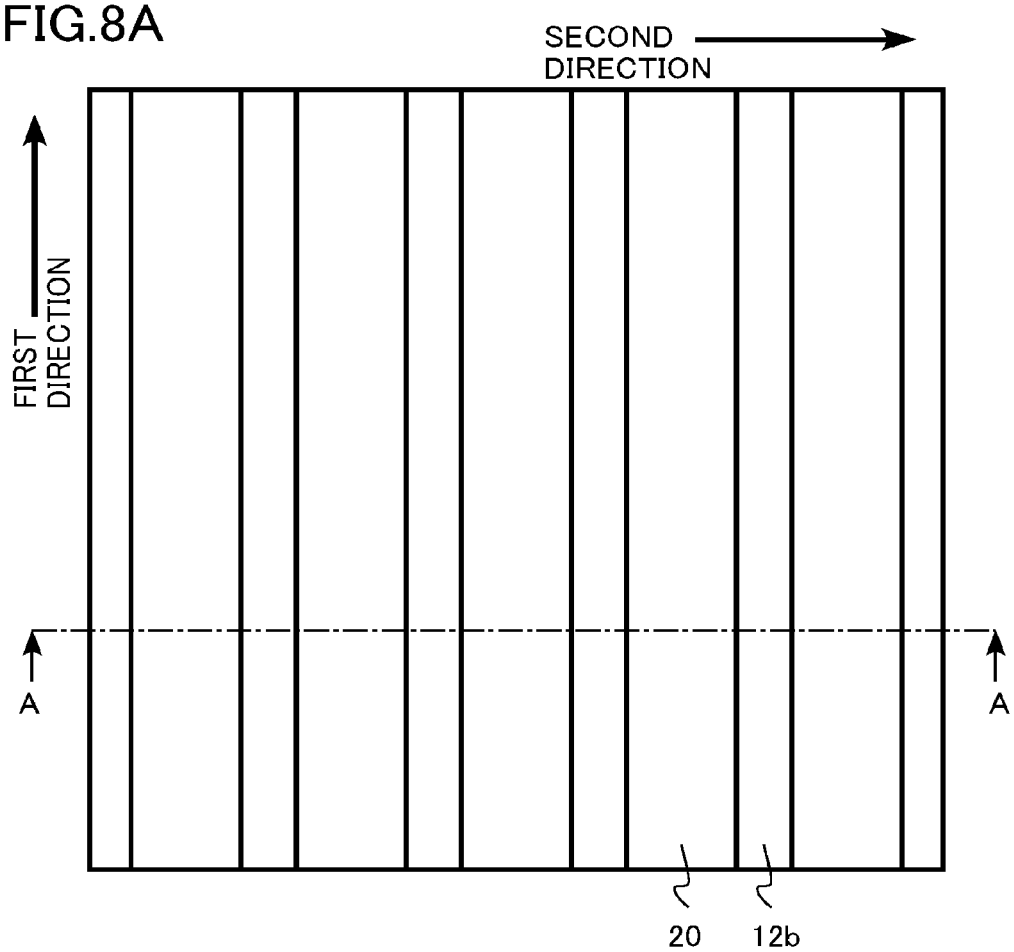
FIGS. 8A, 8B are schematic views illustrating the pattern forming method in the second embodiment.
Figure 8B:
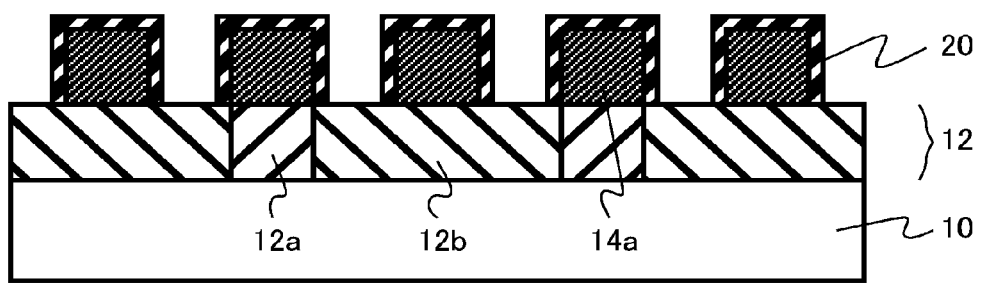

Next, using an ALD process, an oxide layer 20 is selectively formed on the first phase 14a, and the second phase 14b is selectively removed (FIGS. 8A, 8B). Selective growth of the oxide layer 20 onto the first phase 14a and etching of the second phase 14b are performed simultaneously in the same processing by the ALD process.

The oxide layer 20 is, for example, silicon oxide, aluminum oxide, hafnium oxide, zinc oxide, titanium oxide, or zirconia oxide.

When the first polymer has a hydroxyl group (—OH) like PHS, the first phase 14a containing the first polymer resists being etched because the oxide layer 20 is selectively deposited on its surface. On the other hand, when the second polymer does not have a hydroxyl group like PMMA, the second phase 14b containing the second polymer is exposed to ozone in an oxidant or plasma to be easily etched and selectively removed because the oxide layer 20 is not deposited on its surface.

In terms of improving selectivity in the removal of the second phase 14b, the ALD process preferably uses ozone as an oxidant. Alternatively, in terms of improving selectivity in the removal of the second phase 14b, the ALD process preferably uses oxygen plasma.

Figure 9A:
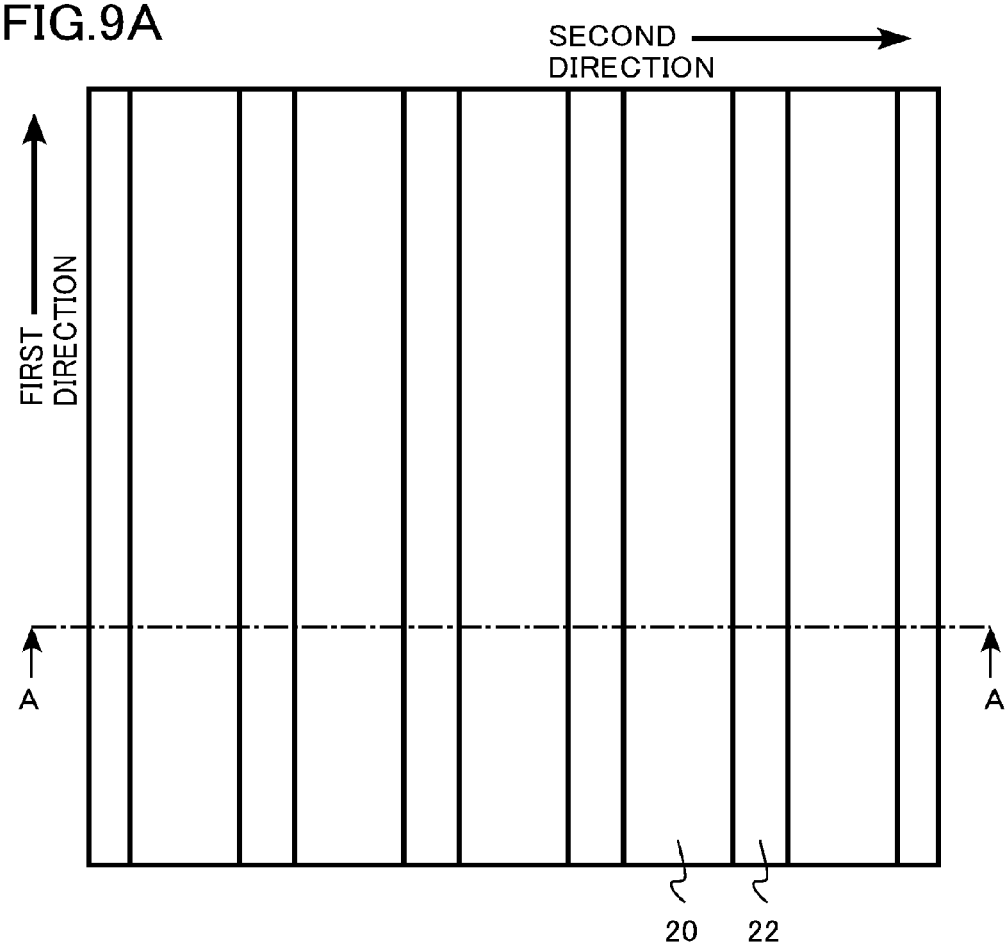
FIGS. 9A, 9B are schematic views illustrating the pattern forming method in the second embodiment.
Figure 9B:
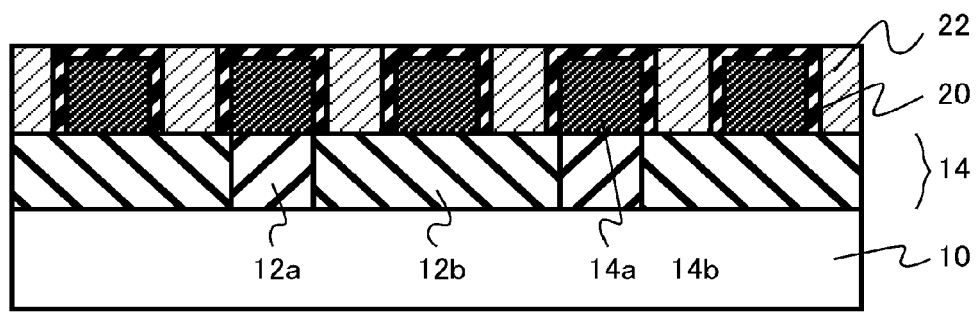

Next, a metal layer 22 is formed in regions from which the second phase 14b is removed (FIGS. 9A, 9B). Specifically, the metal layer 22 is formed in grooves in the oxide layer 20 formed by the ALD process. The metal layer 22 is, for example, nickel (Ni), tungsten (W), molybdenum (Mo), gold (Au), silver (Ag), or copper (Cu).

The metal layer 22 is formed, for example, by a CVD process, a sputtering process, or an electroless plating process. Thereafter, it is planarized by a CMP process, for example.

By the above pattern forming method, the fine metal layer 22 extending in the first direction can be formed.

The following describes the function and effect of the pattern forming method in this embodiment.

In this embodiment, the metal layer 22 is formed using the block copolymer as a self-assembled material. At that time, using the ALD process, the oxide layer 20 is selectively formed on one phase (the first phase 14a) of the phase-separated block copolymer, and the other phase (the second phase 14b) is selectively removed.

For example, suppose that when the ALD process is performed, a precursor for oxide film formation and ozone are supplied. Then, suppose that the first polymer constituting the first phase 14a has a hydrophilic group such as a hydroxyl group, and the second polymer constituting the second phase 14b does not have a hydrophilic group such as a hydroxyl group.

In this case, the precursor is chemically adsorbed selectively on hydrophilic groups in the first phase 14a. On the other hand, the second phase 14b is hydrophobic so that the precursor is hardly adsorbed thereon, and is exposed to ozone to be oxidized, and etching proceeds. On the other hand, the precursor adsorbed on the first phase 14a is oxidized to form the oxide layer 20. By using oxygen plasma instead of ozone, the same phenomenon is also produced.

In this embodiment, the formation of the oxide layer 20 and the patterning are simultaneously performed by the ALD process. Then, the metal layer 22 is formed in spaces in the oxide layer 20 formed by the ALD process. Thus, the metal layer 22 can be formed without performing etching of an oxide, using a line pattern of a minute design rule formed using the phase separation of the block copolymer.

This can reduce complicated steps and high-cost steps for forming the metal layer 22. Thus, the manufacturing process can be simplified and reduced in cost. Accordingly, low-cost minute semiconductor devices and the like can be manufactured.

In terms of improving selectivity in the formation of the oxide layer 20 onto the first phase 14a and selectivity in the removal of the second phase 14b, it is preferred that the first polymer contain, at a side chain, a functional group selected from the group of a hydroxyl group, a carboxyl group, an amino group, an amide group, an isocyanate group, and a pyridine ring, and the second polymer not contain, at a side chain, a functional group selected from the group of a hydroxyl group, a carboxyl group, an amino group, an amide group, an isocyanate group, and a pyridine ring.

According to this embodiment above, a pattern forming method with a simple manufacturing process using a DSA technique can be provided.

(Third Embodiment)

A pattern forming method in this embodiment includes forming, on a substrate, a block copolymer layer containing a first polymer and a second polymer having lower surface energy than the first polymer, heat treating the block copolymer layer to phase-separate the block copolymer layer into a first phase containing the first polymer and a second phase containing the second polymer, and using an atomic layer deposition process, selectively forming an oxide layer on the first phase and selectively removing the second phase.

The pattern forming method in this embodiment further includes, before forming the block copolymer layer, forming, on the substrate, a guide layer in which a first region extending in a first direction and a second region having lower surface energy than the first region and extending in the first direction are alternately arranged, forming the block copolymer layer on the guide layer, and by the heat treatment, phase-separating the block copolymer layer so that the first phase extending in the first direction and the second phase extending in the first direction are alternately arranged.

The pattern forming method in this embodiment further includes etching the substrate with the first phase as a mask.

A DSA technique is applied to the pattern forming method in this embodiment.

FIGS. 10A, 10B to FIGS. 18A, 18B are schematic views illustrating a pattern forming method in this embodiment. FIGS. 10A to 18A are top views, and FIGS. 10B to 18B are cross-sectional views along AA in FIGS. 10A to 18A.

First, a plurality of first regions 12a extending in a first direction is formed on a substrate 10 (FIGS. 10A, 10B). The first regions 12a are formed, for example, through application of an organic material film by a spin coat process, an optical lithography process, and a RIE process. The substrate 10 has a stacked structure of a semiconductor substrate 10a and an insulating layer 10b. The substrate 10a is, for example, a single crystal silicon substrate. The insulating layer 10b is, for example, silicon oxide. The first regions 12a are, for example, poly(4-hydroxystyrene) (PHS—OH), poly (2-vinylpyridine) (P2VP—OH), polyacrylamide (PAAm-OH), or poly(methacrylic acid) (PMAc-OH), all of which have an OH group at one end of a polymer chain.

Figure 11A:
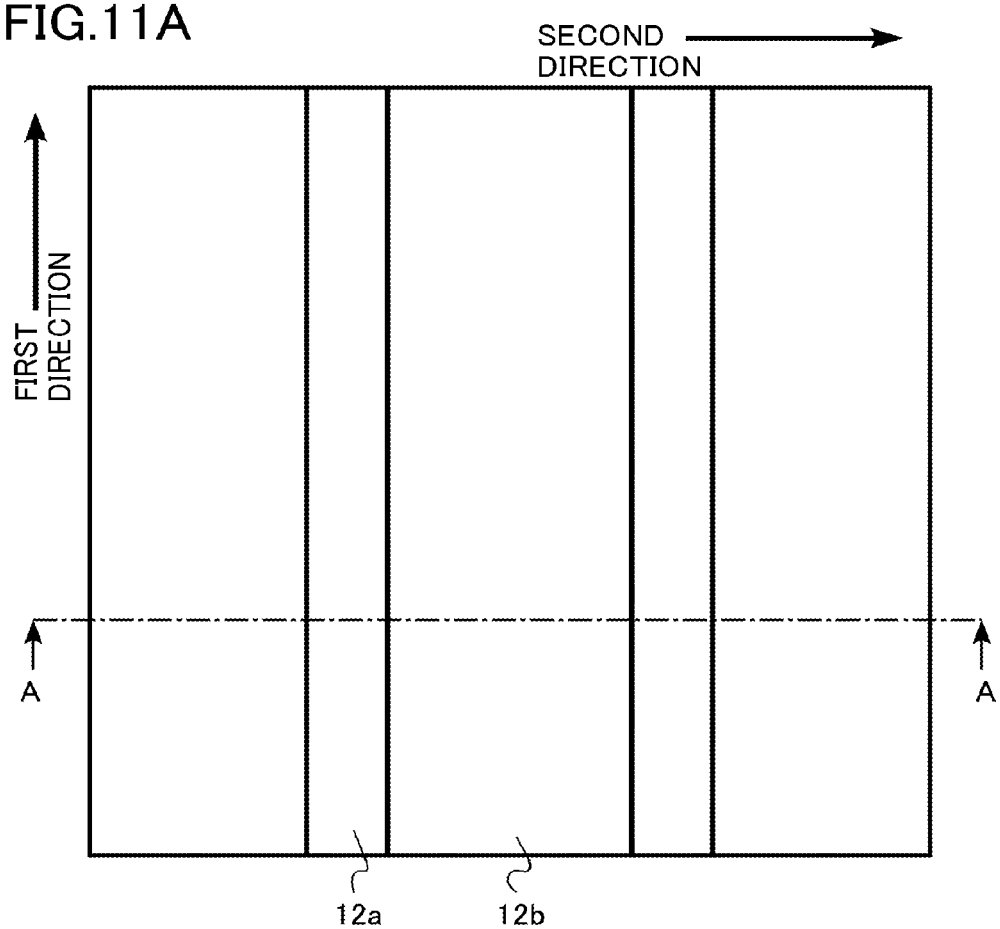
FIGS. 11A, 11B are schematic views illustrating the pattern forming method in the third embodiment.
Figure 11B:
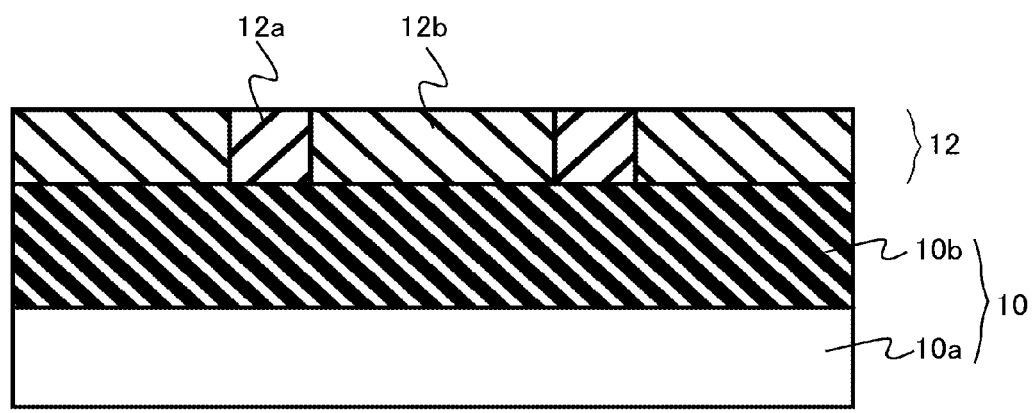

Next, second regions 12b extending in the first direction are formed on surfaces of the substrate 10 exposed between the first regions 12a (FIGS. 11A, 11B). The second regions 12b have lower surface energy than the first regions 12a. In other words, the first regions 12a have a higher degree of hydrophilicity than the second regions 12b. To be precise, the second regions 12b have a substantially middle surface energy value between those of a first polymer and a second polymer of a block copolymer layer 14 formed later.

The second regions 12b are formed through application of an applied organic material film by a spin coat process and removal of excess portions, for example. The second regions 12b are, for example, a poly(4-hydroxystyrene)-poly(methyl methacrylate) random copolymer (PHS-r-PMMA-OH), a polystyrene-poly(2-vinylpyridine) random copolymer (PS-r-P2VP—OH), a poly(4-hydroxystyrene)-poly(methyl acrylate) random copolymer (PHS-r-PMA—OH), a polyacrylamide-poly(methyl methacrylate) random copolymer (PAAm-r-PMMA-OH), a poly(methacrylic acid)-poly (methyl methacrylate) random copolymer (PMAc-r-PMMA-OH), or a polyacrylamide-poly(methyl acrylate) random copolymer (PAAm-r-PMA—OH), all of which have an OH group at one end of a polymer chain.

The alternately arranged first regions 12a and second regions 12b constitute a guide layer 12. At the surface of the guide layer 12, the first regions 12a of relatively high surface energy and the second regions 12b of relatively low surface energy are arranged alternately.

Alternatively, by changing the organic material film to one having photosensitivity, the guide layer 12 may be formed by irradiating regions corresponding to the first regions 12a or the second regions 12b with light by an optical lithography process for surface modification. The irradiation with light enables formation of a structure in which the first regions 12a of relatively high surface energy and the second regions 12b of relatively low surface energy are arranged alternately.

Figure 12A:
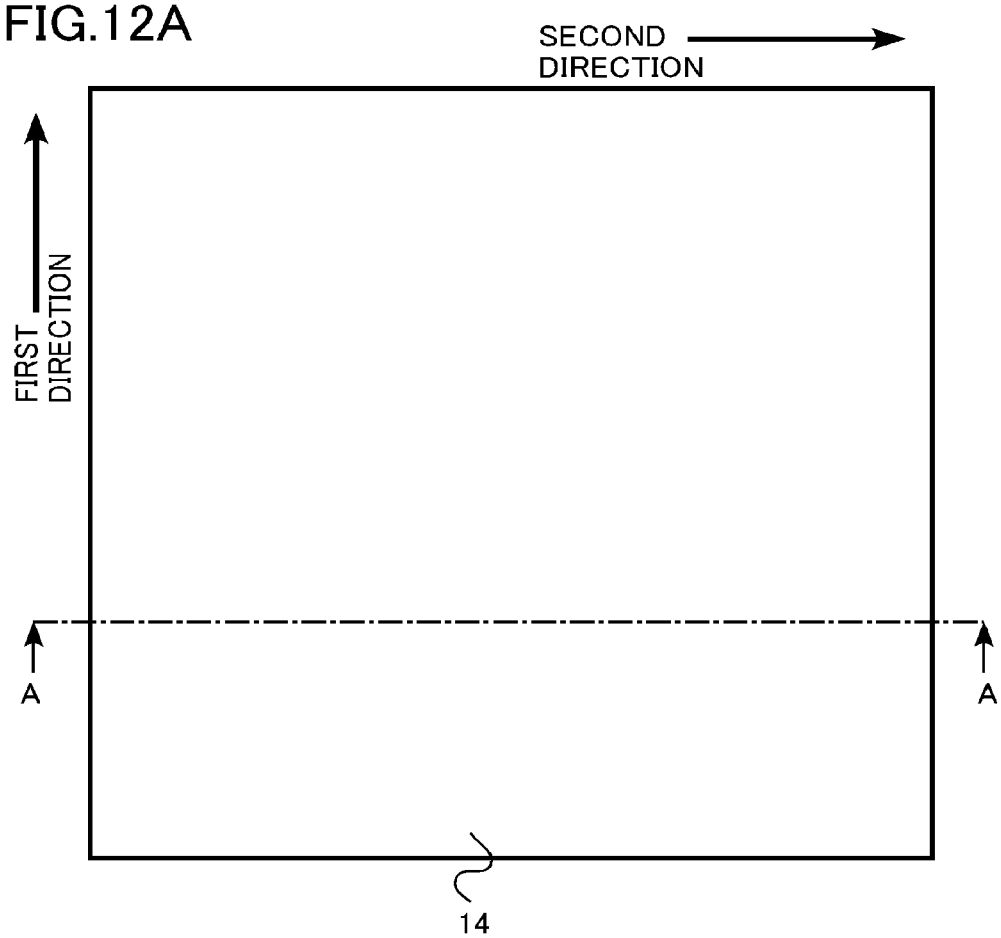
FIGS. 12A, 12B are schematic views illustrating the pattern forming method in the third embodiment.
Figure 12B:
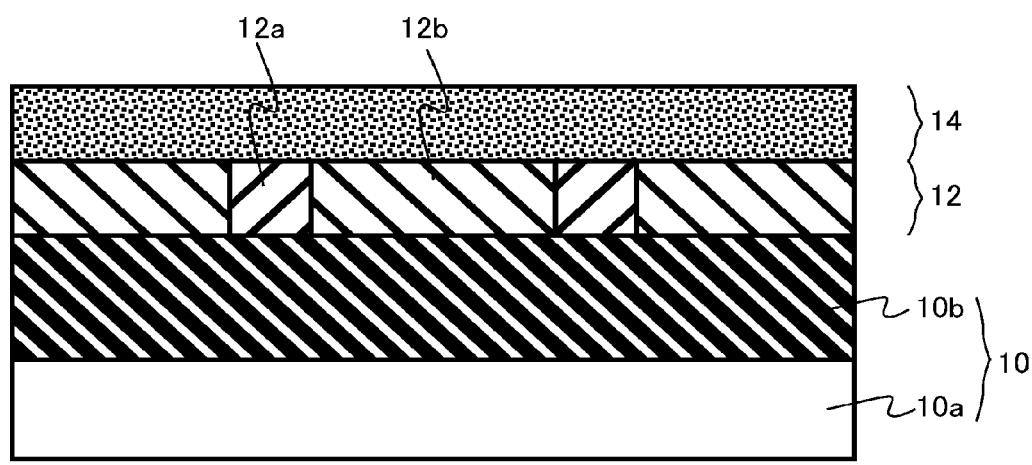

Next, the block copolymer layer 14 is formed on the guide layer 12 (FIGS. 12A, 12B). The block copolymer layer 14 contains the first polymer and the second polymer having lower surface energy than the first polymer. The first polymer has a higher degree of hydrophilicity than the second polymer. The block copolymer layer 14 is formed, for example, by application through a spin coat process.

It is preferred that the first polymer contain, at a side chain, a functional group selected from the group of a hydroxyl group, a carboxyl group, an amino group, an amide group, an isocyanate group, and a pyridine ring, and the second polymer not contain, at a side chain, a functional group selected from the group of a hydroxyl group, a carboxyl group, an amino group, an amide group, an isocyanate group, and a pyridine ring.

The block copolymer layer 14 preferably includes one of the combinations of a polystyrene derivative and a polymethacrylate derivative, a polystyrene derivative and a polyacrylate derivative, a polymethacrylate derivative and a polyacrylate derivative, a polystyrene derivative and a polystyrene derivative, a polymethacrylate derivative and a polymethacrylate derivative, and a polyacrylate derivative and a polyacrylate derivative, in terms of facilitating synthesis.

The first polymer is, for example, poly(4-hydroxystyrene) (PHS), poly(2-hydroxyethyl methacrylate) (PHEMA), poly (2-vinylpyridine) (P2VP), poly(acrylic acid) (PAA), polyacrylamide (PAAm), or poly(methacrylic acid) (PMAc). The second polymer is, for example, poly(hexyl methacrylate) (PHMA), polystyrene (PS), poly(methyl methacrylate) (PMMA), poly(methyl acrylate) (PMA), poly(tert-butyl methacrylate) (PtBMA), or poly(tert-butyl acrylate) (PtBA).

The block copolymer layer 14 is, for example, a poly(4-hydroxystyrene)-poly(methyl methacrylate) block copolymer (PHS-b-PMMA), a polystyrene-poly(2-vinylpyridine) block copolymer (PS-b-P2VP), a poly(4-hydroxystyrene)-poly(methyl acrylate) block copolymer (PHS-b-PMA), a polyacrylamide-poly(methyl methacrylate) block copolymer (PAAm-b-PMMA), a poly(methacrylic acid)-poly (methyl methacrylate) block copolymer (PMAc-b-PMMA), or a polyacrylamide-poly(methyl acrylate) block copolymer (PAAm-b-PMA). In this case, the first polymer is PHS, P2VP, PAAm, or PMAc, and the second polymer is PMMA, PS, or PMA.

Figure 13A:
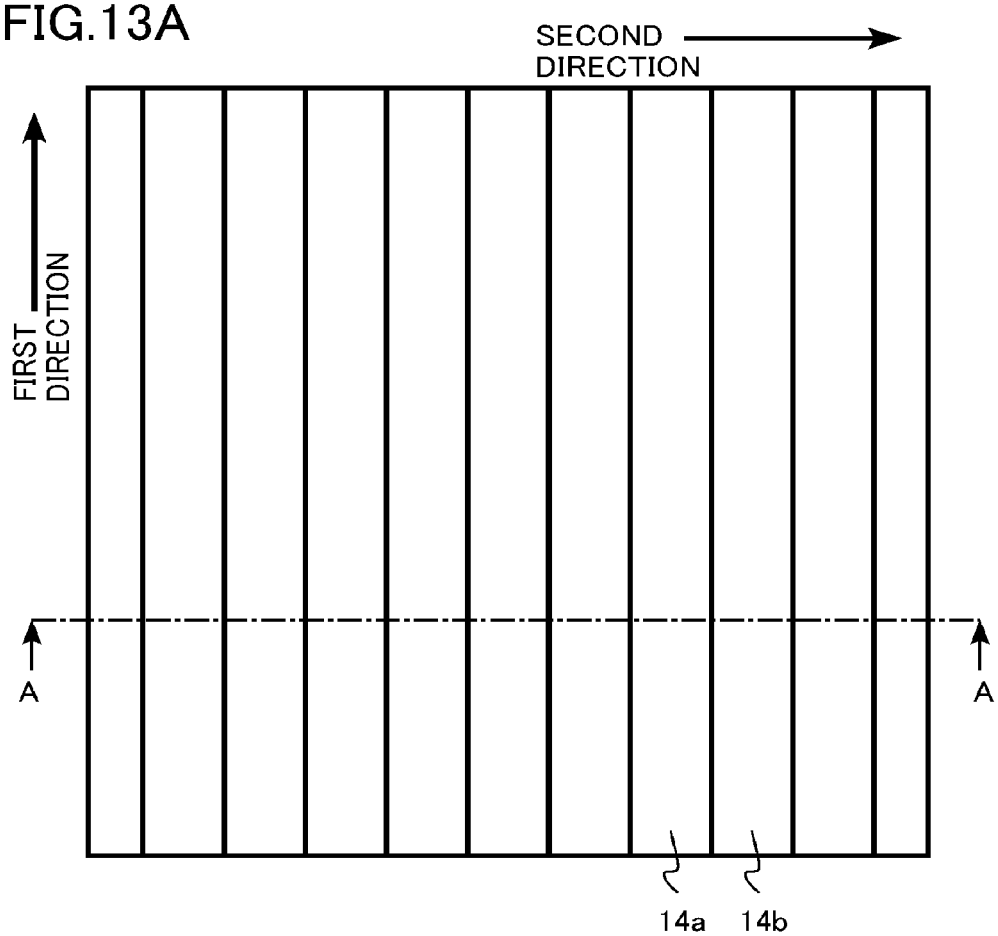
FIGS. 13A, 13B are schematic views illustrating the pattern forming method in the third embodiment.
Figure 13B:
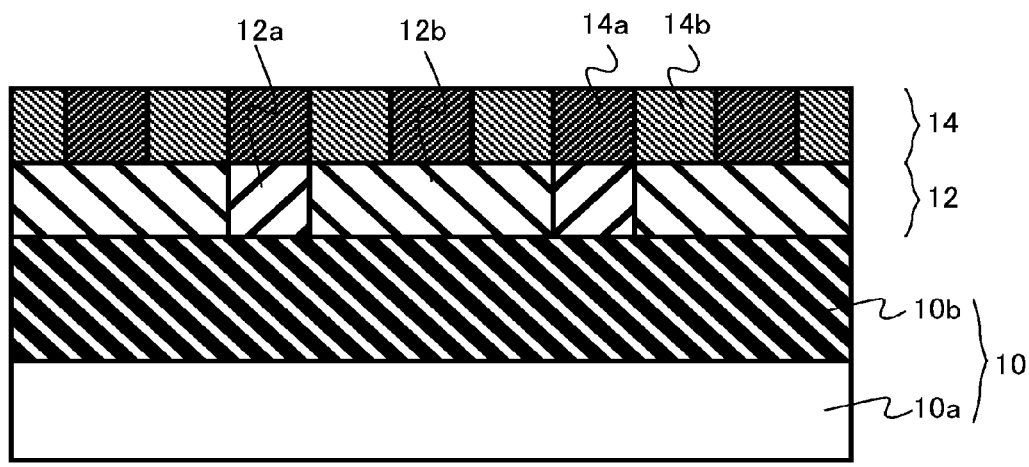

Next, the block copolymer layer 14 is heat-treated to be phase-separated into a first phase 14a and a second phase 14b (FIGS. 13A, 13B). The first phase 14a contains the first polymer and extends in the first direction. The second phase 14b contains the second polymer and extends in the first direction. Due to the separation, the first phase 14a and the second phase 14b are arranged alternately.

Figure 14A:
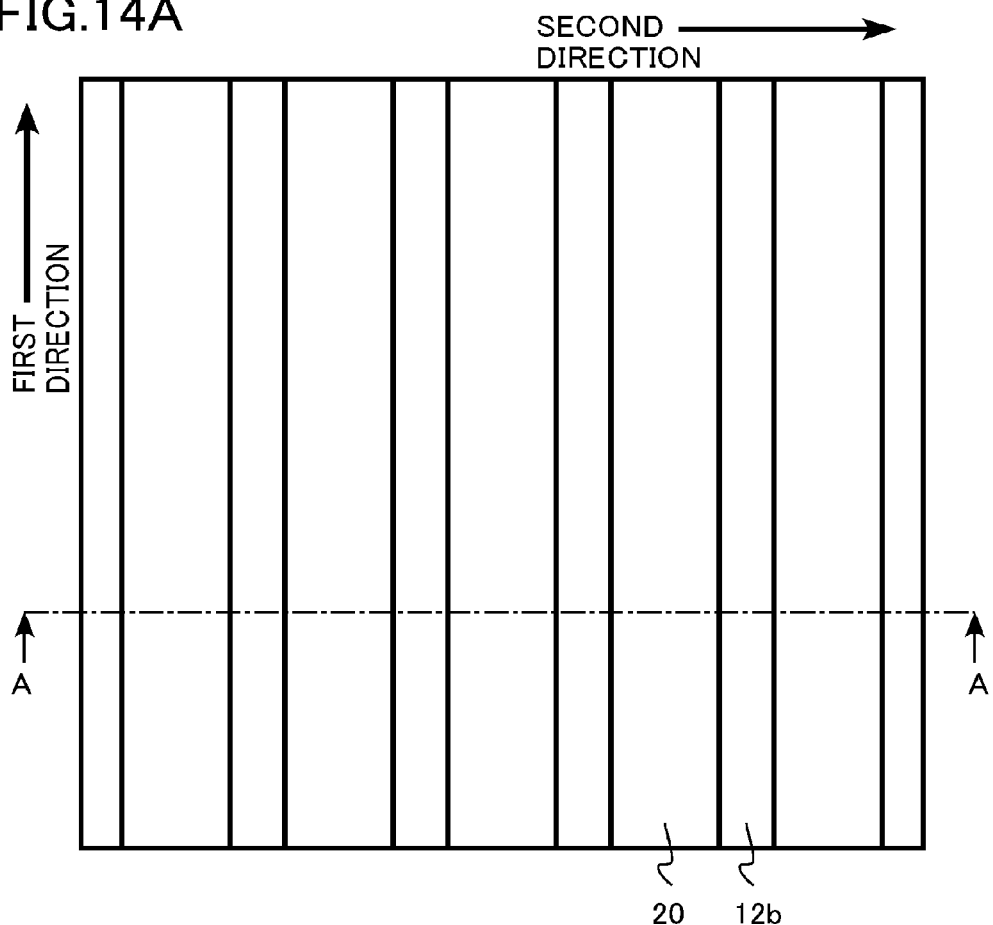
FIGS. 14A, 14B are schematic views illustrating the pattern forming method in the third embodiment.
Figure 14B:
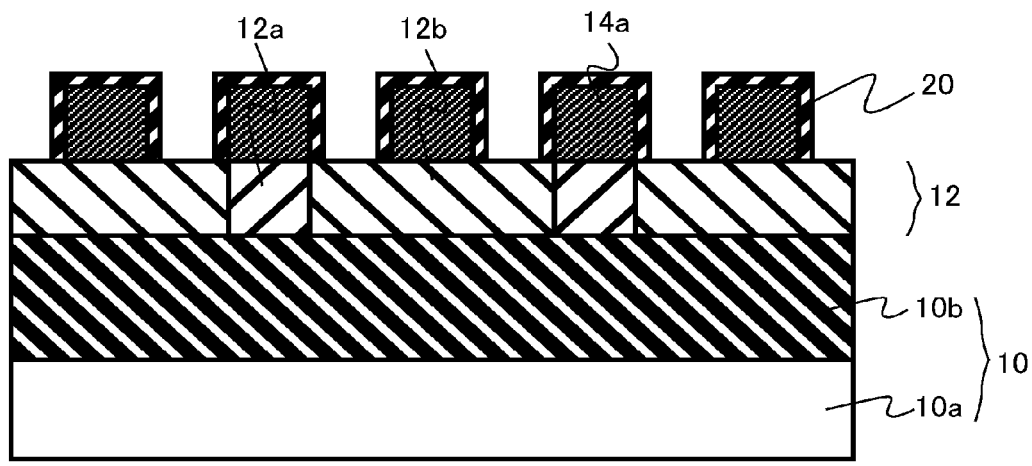

Next, using an ALD method, an oxide layer 20 is selectively formed on the first phase 14a, and at the same time, the second phase 14b is selectively removed (FIGS. 14A, 14B). The oxide layer 20 is, for example, silicon oxide, aluminum oxide, hafnium oxide, zinc oxide, titanium oxide, or zirconia oxide.

When the first polymer has a hydroxyl group (—OH) like PHS, the first phase 14a containing the first polymer resists being etched because the oxide layer 20 is selectively deposited on its surface. On the other hand, when the second polymer does not have a hydroxyl group like PMMA, the second phase 14b containing the second polymer is exposed to ozone in an oxidant or plasma to be easily etched and selectively removed because the oxide layer 20 is not deposited on its surface.

In terms of improving selectivity in the removal of the second phase 14b, the ALD process preferably uses ozone as an oxidant. Alternatively, in terms of improving selectivity in the removal of the second phase 14b, the ALD process preferably uses oxygen plasma.

Figure 15A:
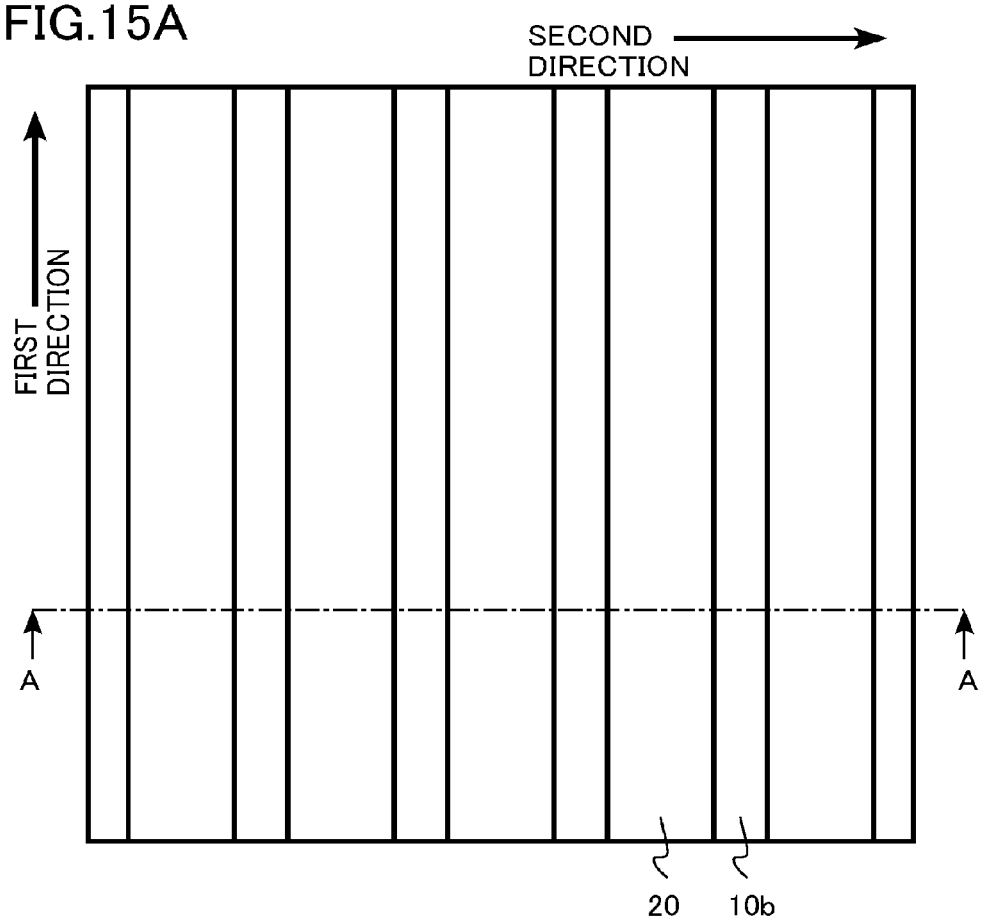
FIGS. 15A, 15B are schematic views illustrating the pattern forming method in the third embodiment.
Figure 15B:
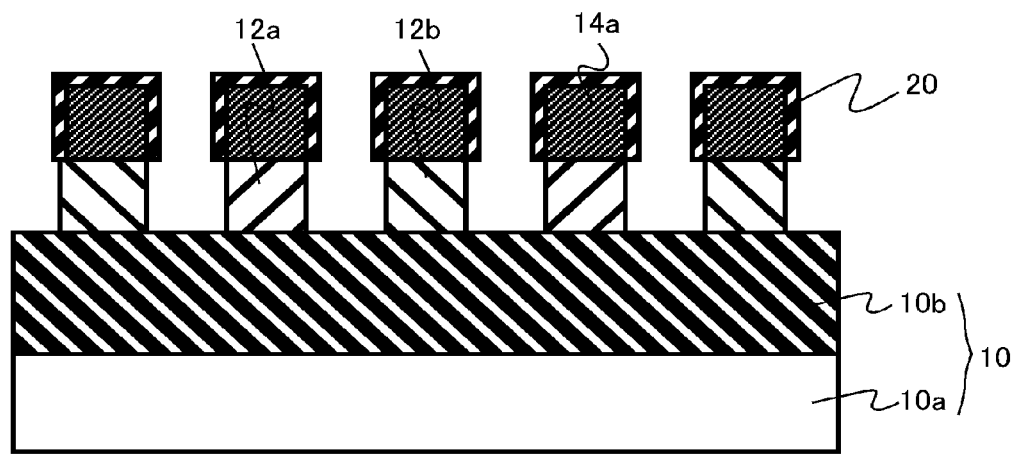

Next, with the first phase 14a on which the oxide layer 20 is selectively formed as a mask, the second regions 12b are etched by an RIE process, for example (FIGS. 15A, 15B).

Figure 16A:
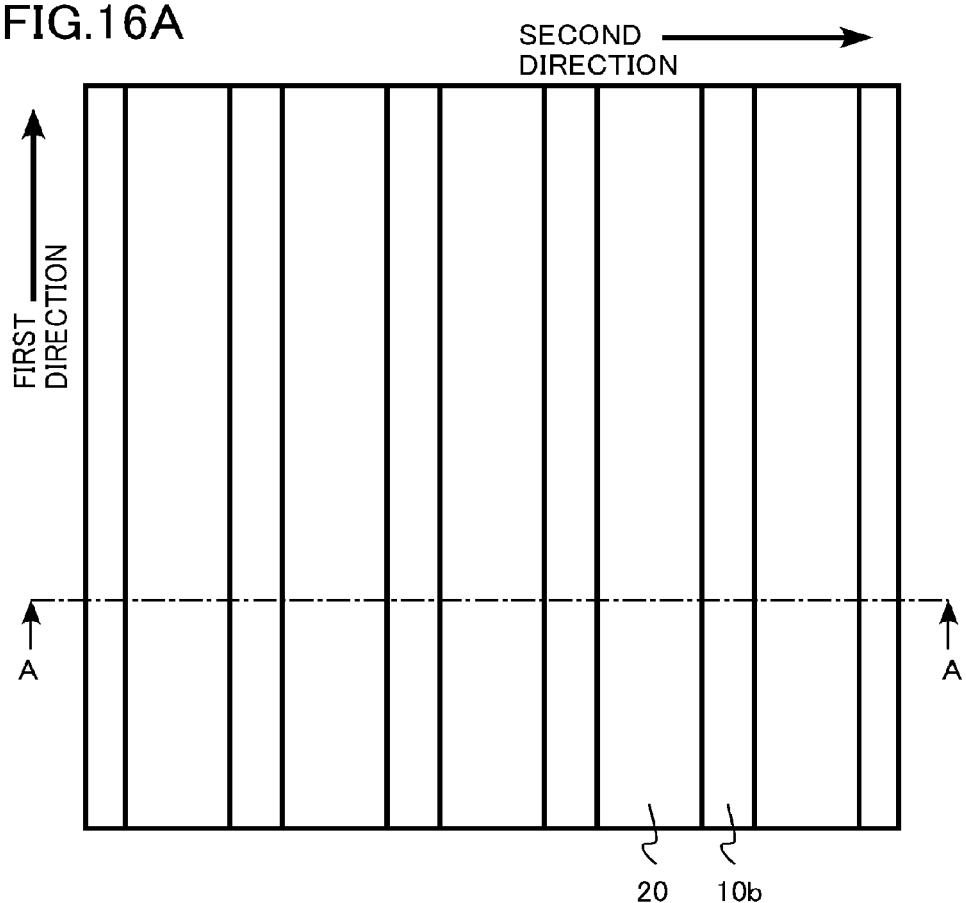
FIGS. 16A, 16B are schematic views illustrating the pattern forming method in the third embodiment.
Figure 16B:
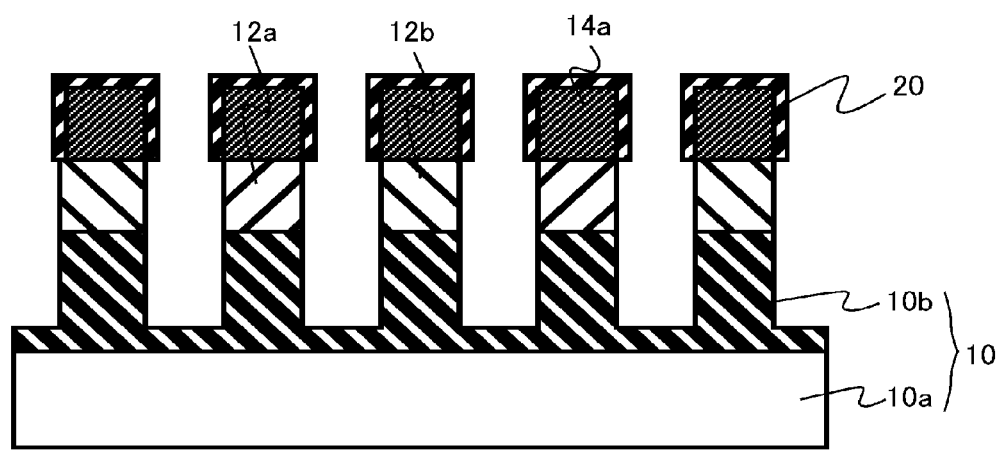

Next, with the first phase 14a on which the oxide layer 20 is selectively formed as a mask, the insulating layer 10b is etched to form grooves. The insulating layer 10b is etched by an RIE process, for example (FIGS. 16A, 16B).

Figure 17A:
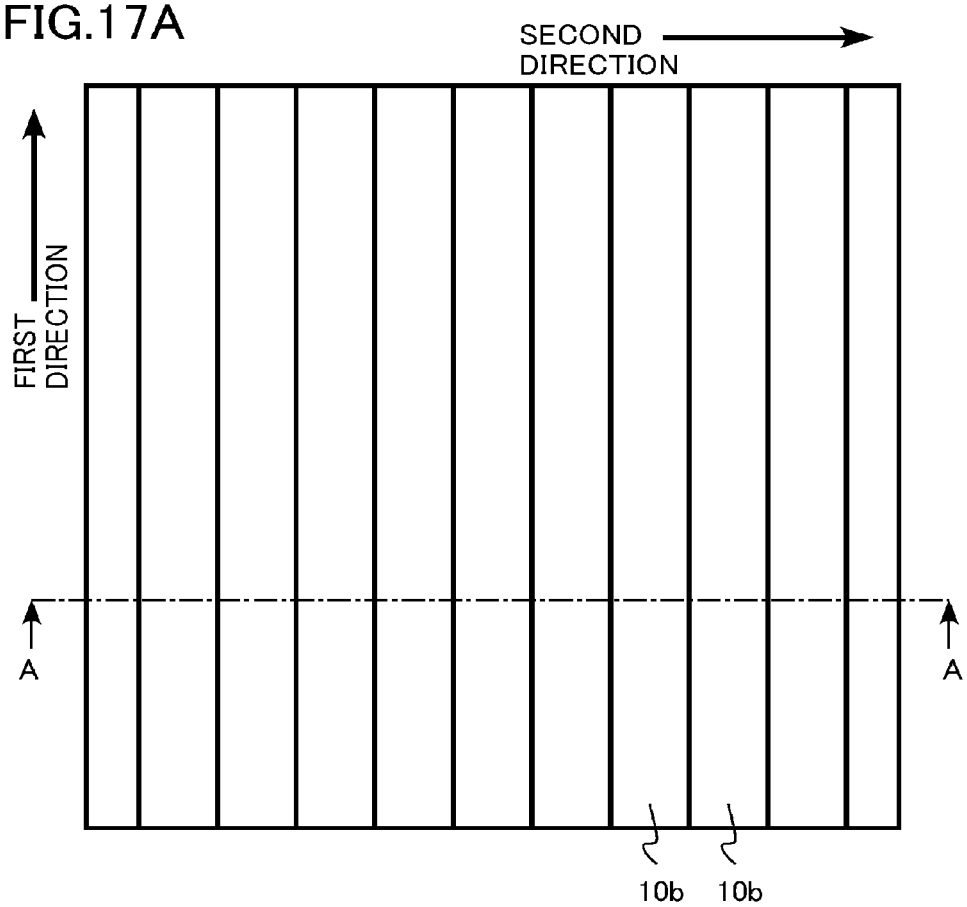
FIGS. 17A, 17B are schematic views illustrating the pattern forming method in the third embodiment.
Figure 17B:
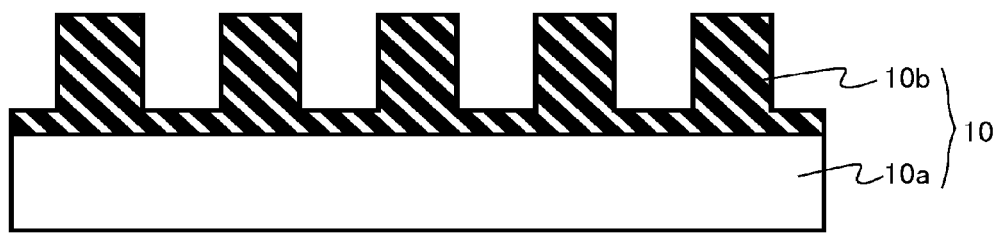

Next, the first phase 14a, the first regions 12a, and the second regions 12b on the insulating layer 10b are removed (FIGS. 17A, 17B). The removal of the first phase 14a, the first regions 12a, and the second regions 12b are performed by ashing, for example.

Figure 18A:
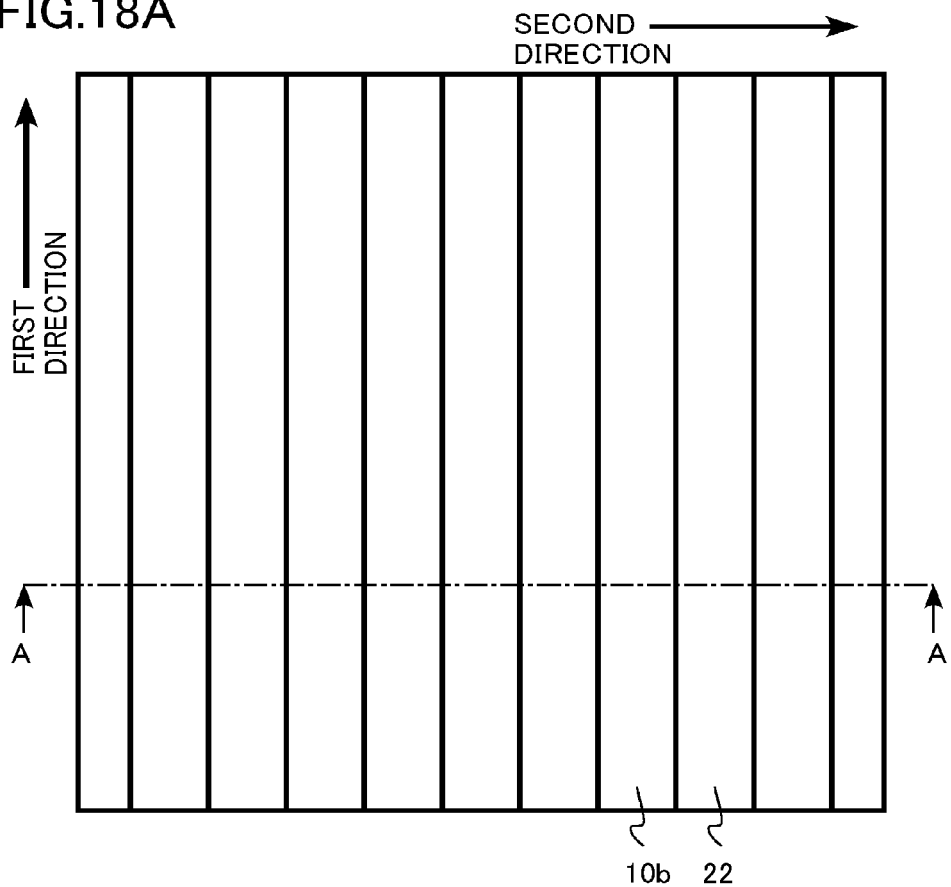
FIGS. 18A, 18B are schematic views illustrating the pattern forming method in the third embodiment.
Figure 18B:
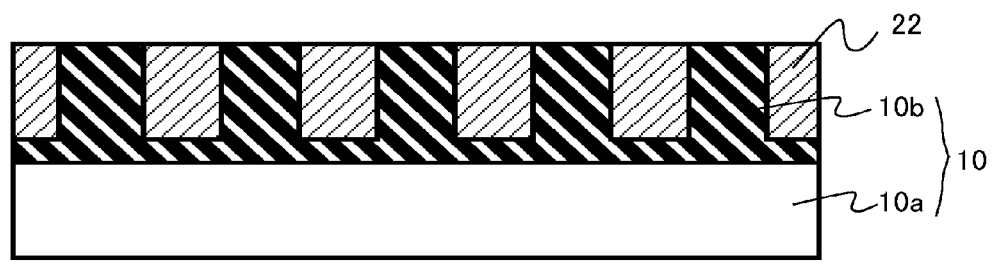

Next, the metal layer 22 is formed in the grooves of the insulating layer 10b (FIGS. 18A, 18B). The metal layer 22 is, for example, nickel (Ni), tungsten (W), molybdenum (Mo), gold (Au), silver (Ag), or copper (Cu).

The metal layer 22 is formed by a CVD process, a sputtering process, or an electroless plating process, for example. Thereafter, it is planarized by a CMP process, for example.

By the above pattern forming method, the fine metal layer 22 extending in the first direction can be formed.

The following describes the function and effect of the pattern forming method in this embodiment.

A polymer pattern formed by a DSA technique does not have sufficient dry etching resistance. Therefore, for dry etching processing with a polymer pattern formed by a DSA technique as a mask, there is a method of previously forming an oxide protective film selectively on the pattern. In this case, although dry etching resistance is provided, an additional step of forming a protective film is required, complicating the manufacturing process.

In this embodiment, the grooves in the insulating layer 10b are etched with the polymer pattern formed by the DSA technique as a mask. At this time, using the ALD process, the oxide layer 20 is selectively formed on one phase (the first phase 14a) of the phase-separated block copolymer, and the other phase (the second phase 14b) is selectively removed. That is, formation of the oxide layer 20 to be a protective film and the polymer patterning are performed simultaneously by the ALD process.

This can reduce complicated steps and high-cost steps for forming a protective film for a polymer pattern. Thus, the manufacturing process can be simplified and reduced in cost. Accordingly, low-cost minute semiconductor devices and the like can be manufactured.

As above, according to this embodiment, a pattern forming method with a simple manufacturing process using a DSA technique can be provided.

(Fourth Embodiment)

A pattern forming method in this embodiment includes forming, on a substrate, a block copolymer layer containing a first polymer and a second polymer having lower surface energy than the first polymer, heat treating the block copolymer layer to phase-separate the block copolymer layer into a first phase containing the first polymer and a second phase containing the second polymer, and using an atomic layer deposition process, selectively forming an oxide layer on the first phase and selectively removing the second phase.

The pattern forming method in this embodiment further includes, before forming the block copolymer layer, forming a guide layer having an opening, forming the block copolymer layer in the opening, and by the heat treatment, phase-separating the block copolymer layer into the first phase and the second phase surrounded by the first phase.

The pattern forming method in this embodiment further includes etching the substrate with the first phase as a mask.

A DSA technique is applied to the pattern forming method in this embodiment.

FIGS. 19A, 19B to FIGS. 24A, 24B are schematic views illustrating a pattern forming method in this embodiment. FIGS. 19A to 24A are top views, and FIGS. 19B to 24B are cross-sectional views along AA in FIGS. 19A to 24A.

Figure 19A:
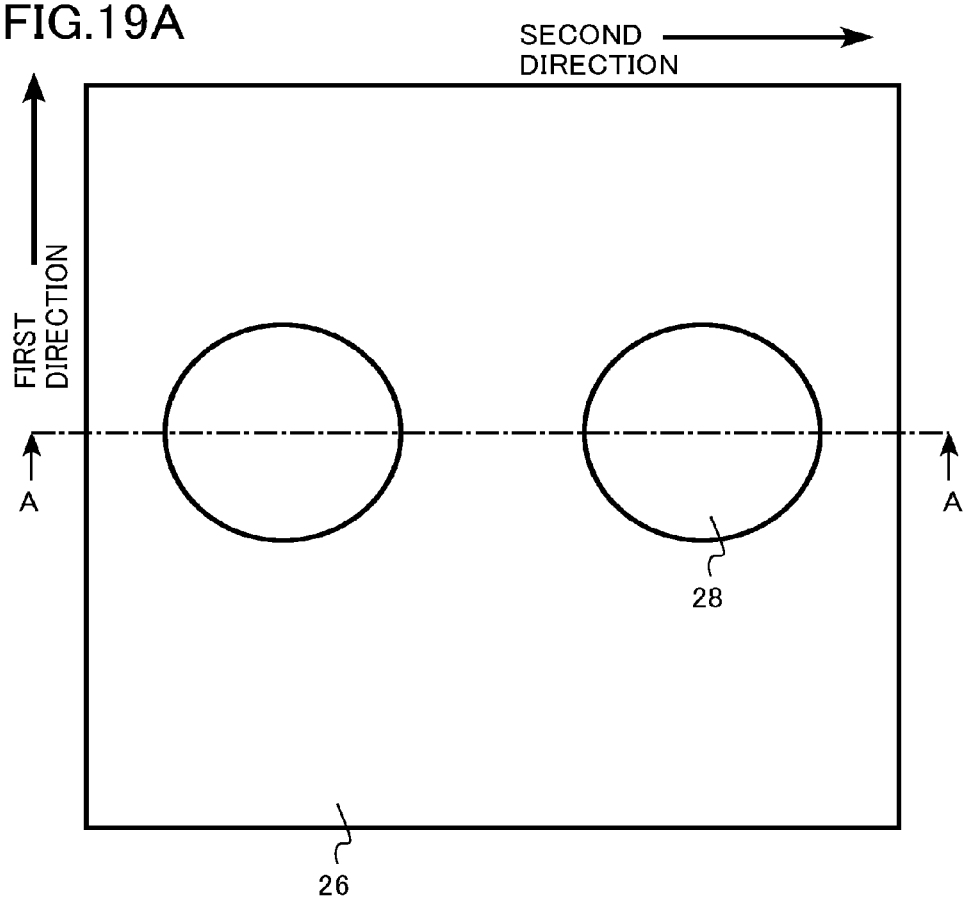
FIGS. 19A, 19B are schematic views illustrating a pattern forming method in a fourth embodiment.
Figure 19B:
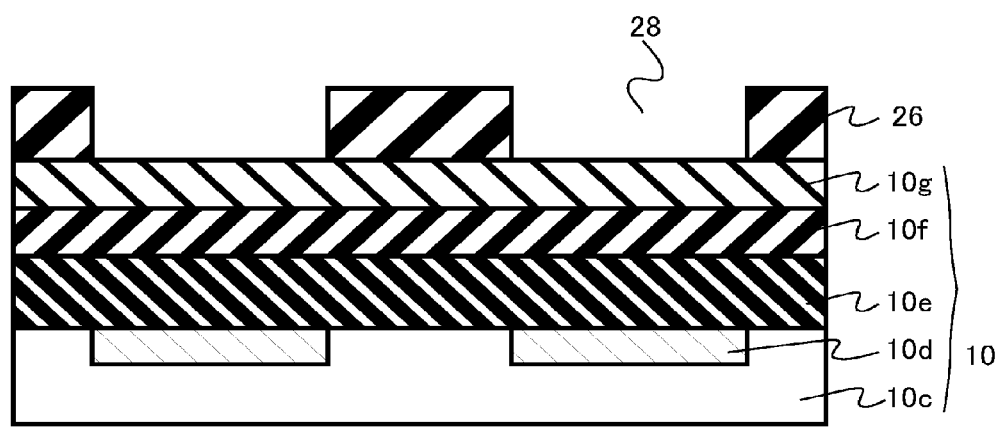

First, a photoresist (guide layer) 26 having openings 28 is formed on a substrate 10 (FIGS. 19A, 19B). The openings 28 are formed using an optical lithography process.

The substrate 10 has a stacked structure of a first insulating layer 10c, a second insulating layer 10e, a spin-on carbon (SOC) layer 10f, and a spin-on glass (SOG) layer 10g. A metal wiring layer 10d is provided between the first insulating layer 10c and the second insulating layer 10e.

Figure 20A:
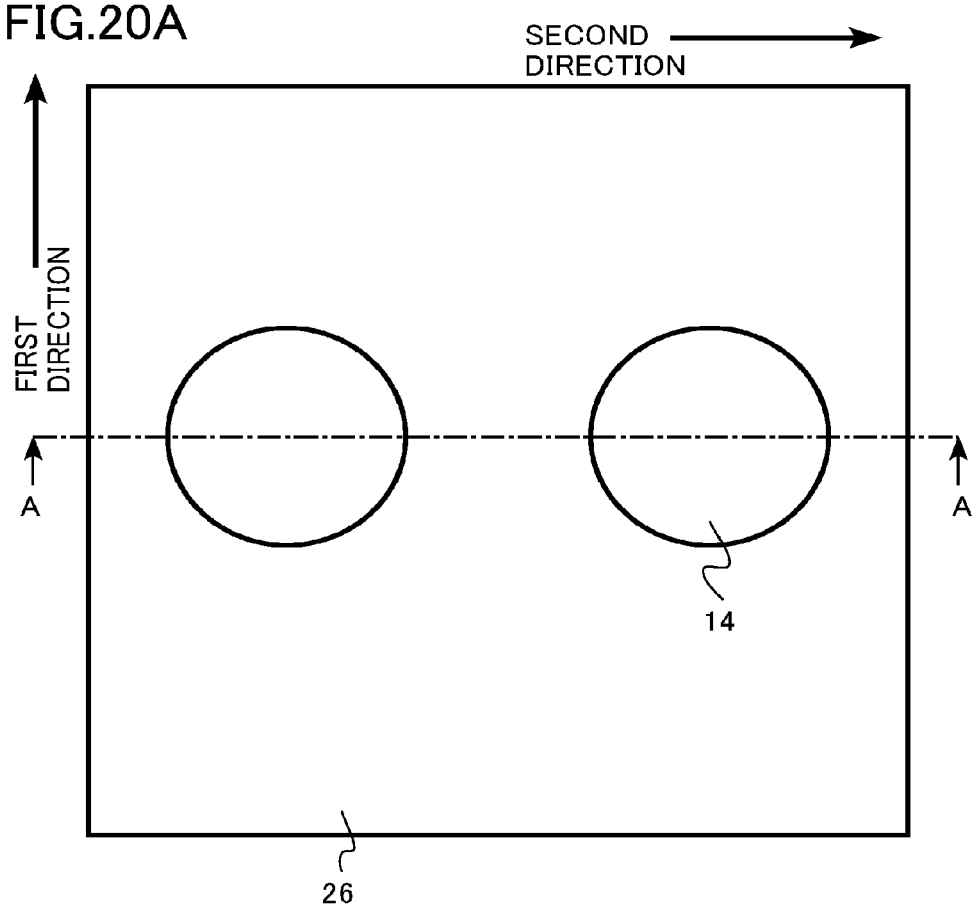
FIGS. 20A, 20B are schematic views illustrating the pattern forming method in the fourth embodiment.
Figure 20B:
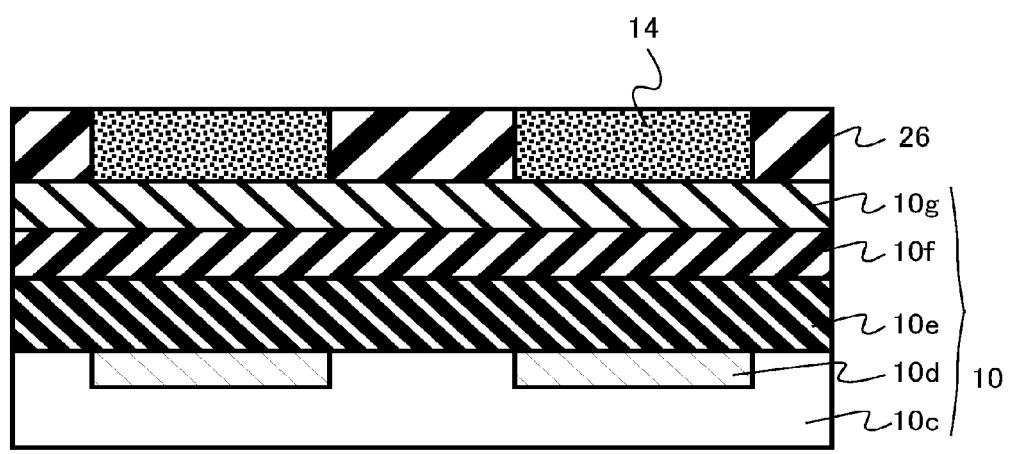

Next, a block copolymer layer 14 is formed in the openings 28 (FIGS. 20A, 20B). The block copolymer layer 14 contains a first polymer and a second polymer having lower surface energy than the first polymer. The first polymer has a higher degree of hydrophilicity than the second polymer. The block copolymer layer 14 is formed by application through a spin coat process.

It is preferred that the first polymer contain, at a side chain, a functional group selected from the group of a hydroxyl group, a carboxyl group, an amino group, an amide group, an isocyanate group, and a pyridine ring, and the second polymer not contain, at a side chain, a functional group selected from the group of a hydroxyl group, a carboxyl group, an amino group, an amide group, an isocyanate group, and a pyridine ring.

The block copolymer layer 14 preferably includes one of the combinations of a polystyrene derivative and a polymethacrylate derivative, a polystyrene derivative and a polyacrylate derivative, a polymethacrylate derivative and a polyacrylate derivative, a polystyrene derivative and a polystyrene derivative, a polymethacrylate derivative and a polymethacrylate derivative, and a polyacrylate derivative and a polyacrylate derivative, in terms of facilitating synthesis.

The first polymer is, for example, poly(4-hydroxystyrene) (PHS), poly(2-hydroxyethyl methacrylate) (PHEMA), poly (2-vinylpyridine) (P2VP), poly(acrylic acid) (PAA), polyacrylamide (PAAm), or poly(methacrylic acid) (PMAc). The second polymer is, for example, poly(hexyl methacrylate) (PHMA), polystyrene (PS), poly(methyl methacrylate) (PMMA), poly(methyl acrylate) (PMA), poly(tert-butyl methacrylate) (PtBMA), or poly(tert-butyl acrylate) (PtBA).

The block copolymer layer 14 is, for example, a poly(4-hydroxystyrene)-poly(methyl methacrylate) block copolymer (PHS-b-PMMA), a polystyrene-poly(2-vinylpyridine) block copolymer (PS-b-P2VP), a poly(4-hydroxystyrene)-poly(methyl acrylate) block copolymer (PHS-b-PMA), a polyacrylamide-poly(methyl methacrylate) block copolymer (PAAm-b-PMMA), a poly(methacrylic acid)-poly (methyl methacrylate) block copolymer (PMAc-b-PMMA), or a polyacrylamide-poly(methyl acrylate) block copolymer (PAAm-b-PMA). In this case, the first polymer is PHS, P2VP, PAAm, or PMAc, and the second polymer is PMMA, PS, or PMA.

Figure 21A:
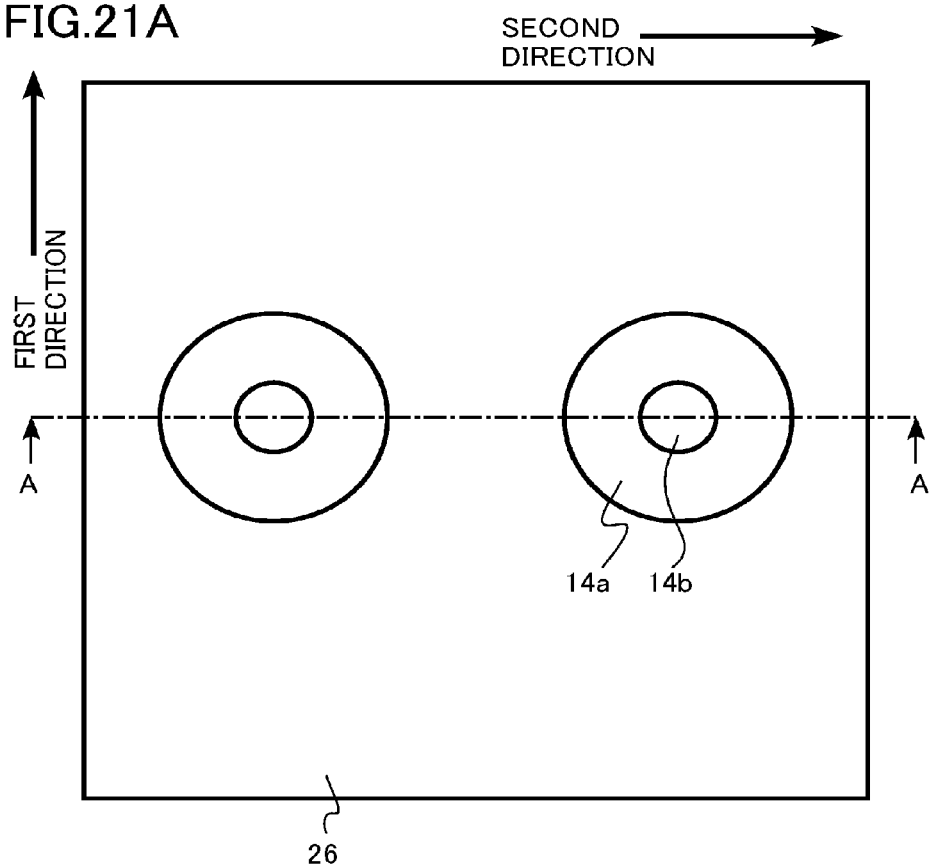
FIGS. 21A, 21B are schematic views illustrating the pattern forming method in the fourth embodiment.
Figure 21B:
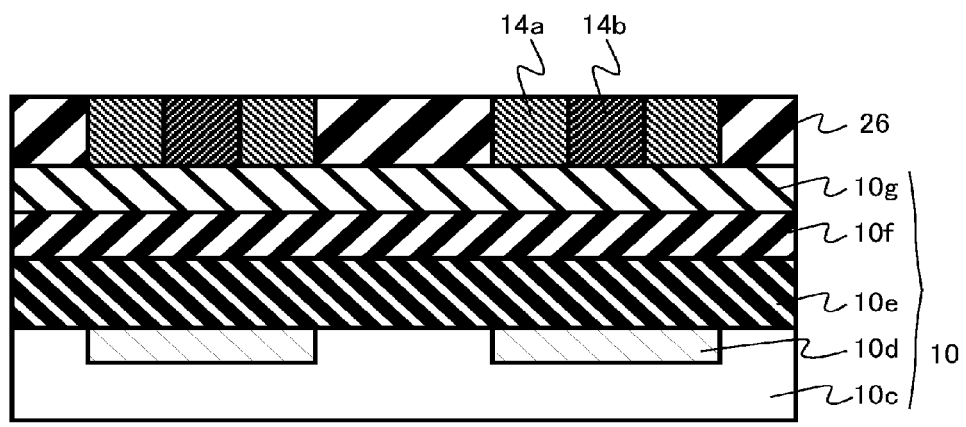

Next, the block copolymer layer 14 is heat-treated to be phase-separated into a first phase 14a and a second phase 14b (FIGS. 21A, 21B). The first phase 14a contains the first polymer and the second phase 14b contains the second polymer. The second phase 14b is surrounded by the first phase 14a.

Figure 22A:
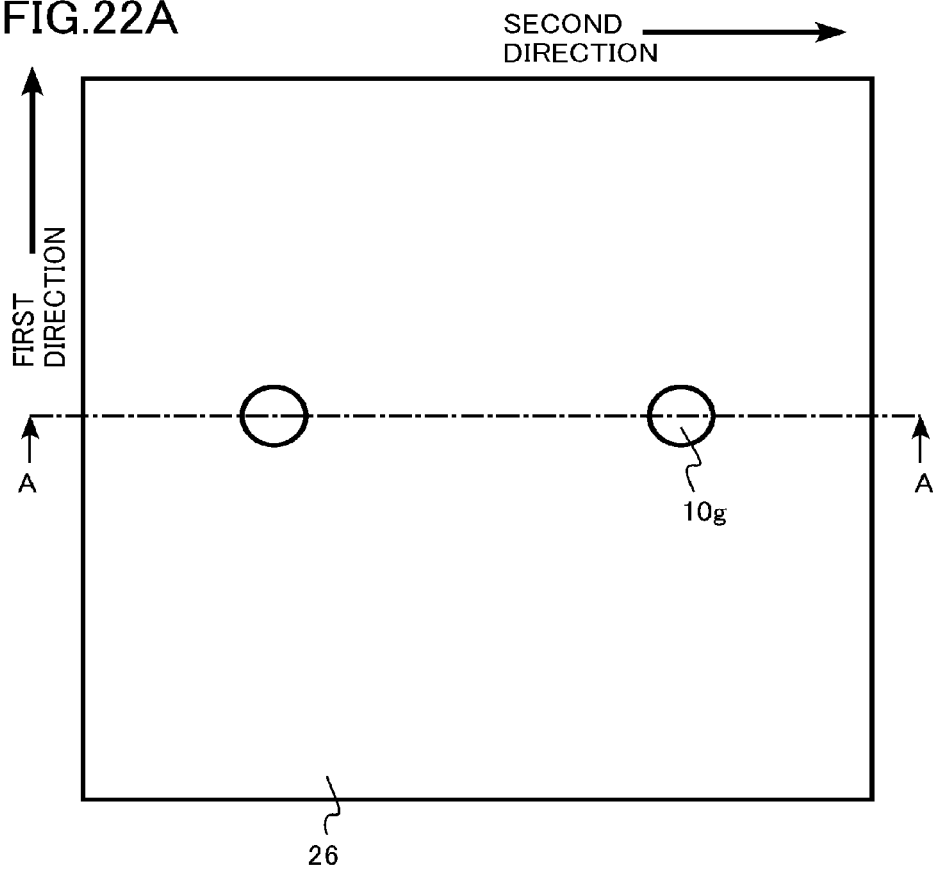
FIGS. 22A, 22B are schematic views illustrating the pattern forming method in the fourth embodiment.
Figure 22B:
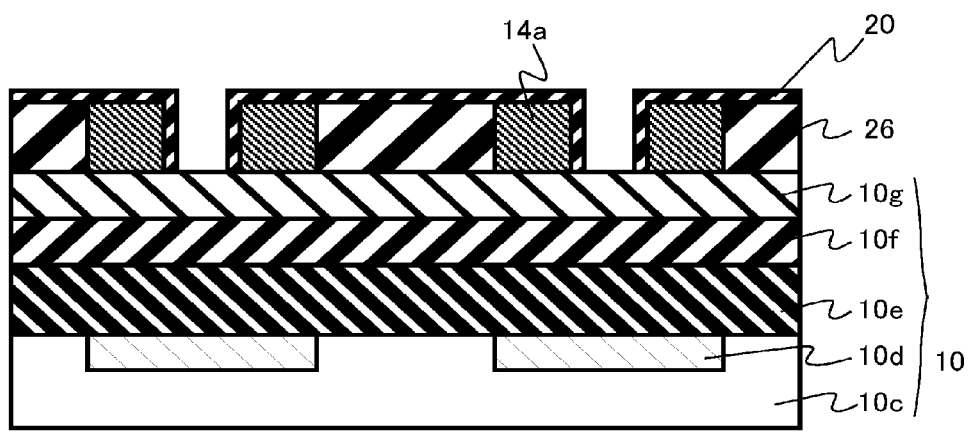

Next, using an ALD process, an oxide layer 20 is selectively formed on the first phase 14a and the photoresist 26, and at the same time, the second phase 14b is selectively removed (FIGS. 22A, 22B). The oxide layer 20 is, for example, silicon oxide, aluminum oxide, or hafnium oxide.

When the first polymer has a hydroxyl group (—OH) like PHS, the first phase 14a containing the first polymer resists being etched because the oxide layer 20 is selectively deposited on its surface. On the other hand, when the second polymer does not have a hydroxyl group like PMMA, the second phase 14b containing the second polymer is exposed to ozone in an oxidant or plasma to be easily etched and selectively removed because the oxide layer 20 is not deposited on its surface.

In terms of improving selectivity in the removal of the second phase 14b, the ALD process preferably uses ozone as an oxidant. Alternatively, in terms of improving selectivity in the removal of the second phase 14b, the ALD process preferably uses oxygen plasma.

Figure 23A:
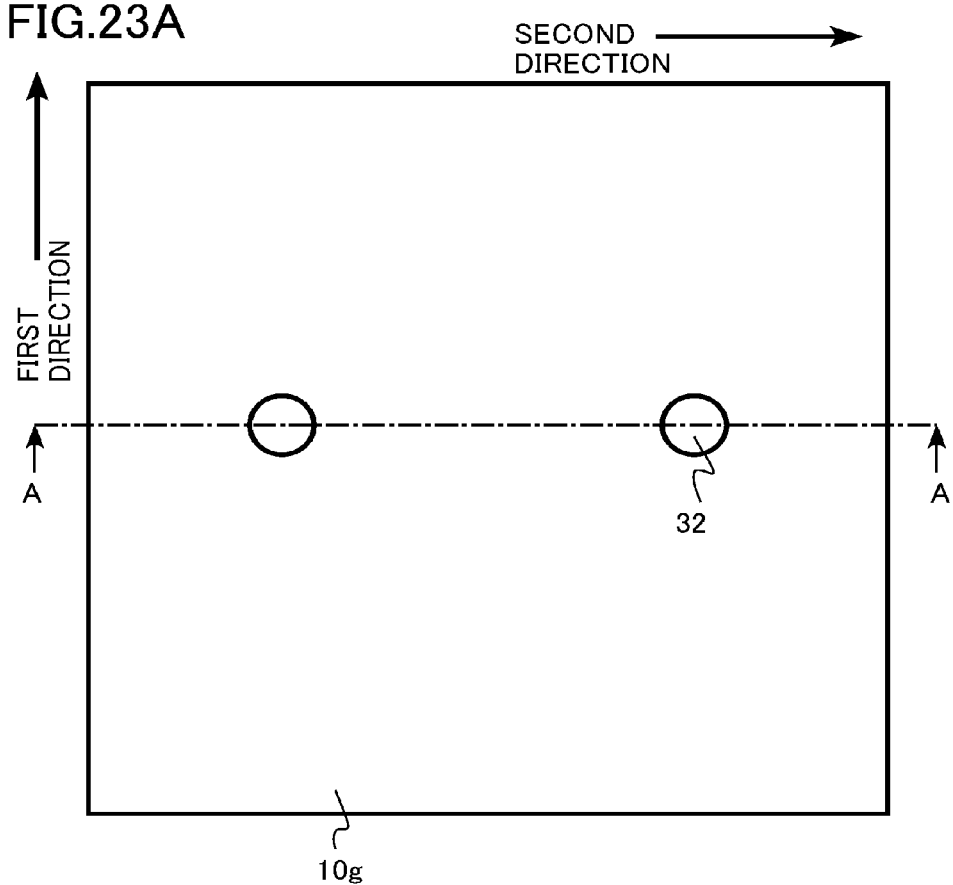
FIGS. 23A, 23B are schematic views illustrating the pattern forming method in the fourth embodiment.
Figure 23B:
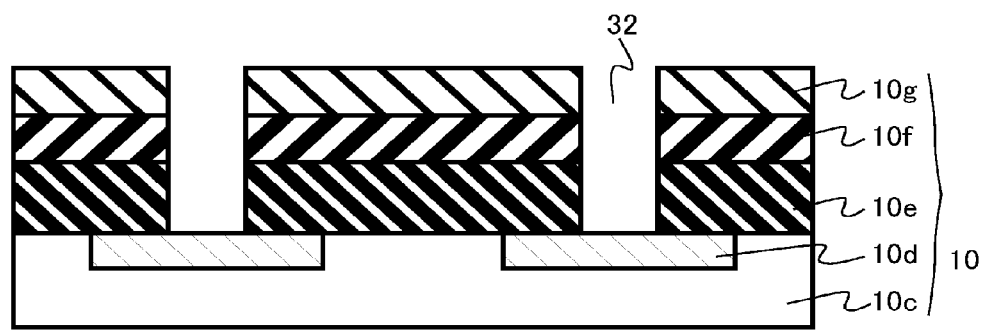

Next, with the first phase 14a on which the oxide layer 20 is selectively formed as a mask, the SOG layer 10g, the SOC layer 10f, and the second insulating layer 10e are etched to form contact holes 32. For the etching, for example, etching by an RIE process is performed (FIGS. 23A, 23B).

Next, the SOC layer 10f and the SOG layer 10g on the second insulating layer 10e are removed.

Figure 24A:
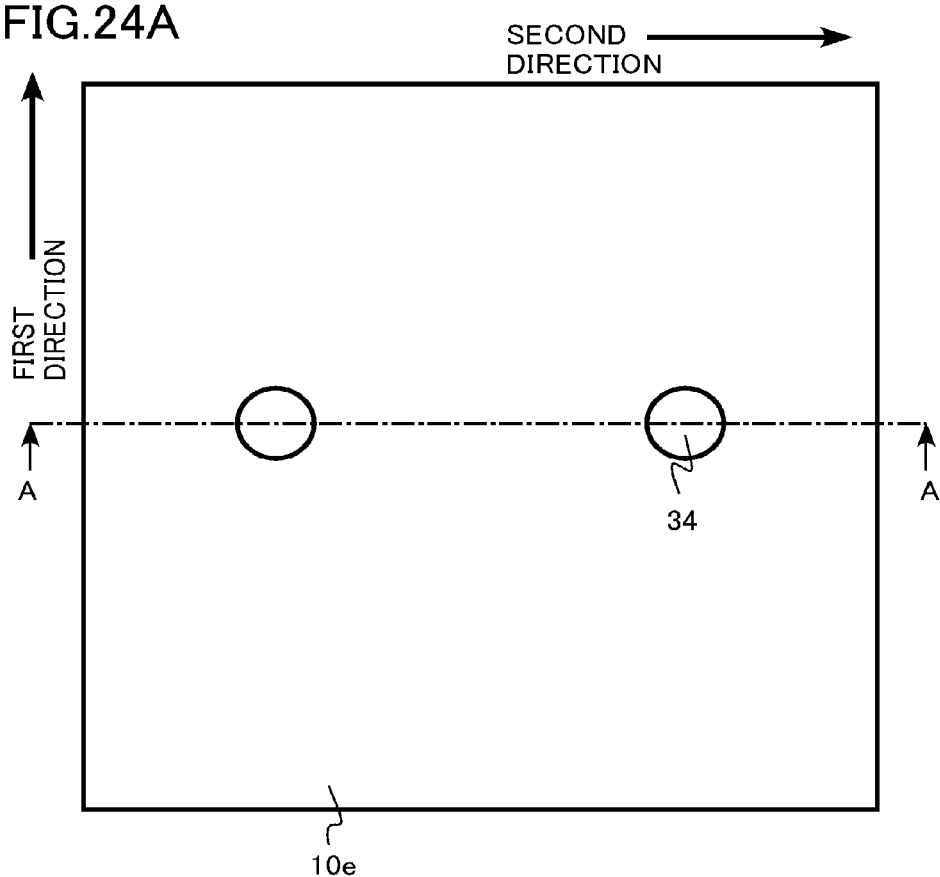
FIGS. 24A, 24B are schematic views illustrating the pattern forming method in the fourth embodiment.
Figure 24B:
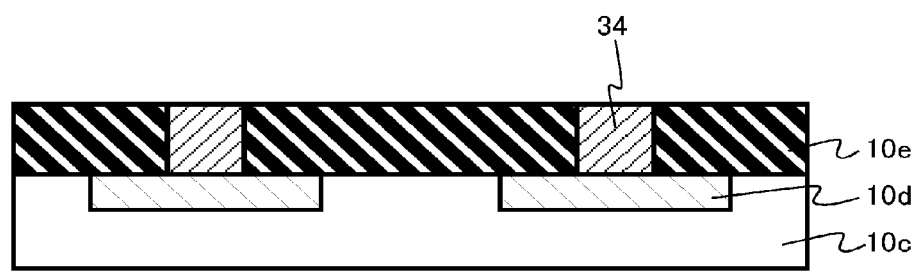

Next, metal plugs 34 are formed in the contact holes 32 (FIGS. 24A, 24B). The metal plugs 34 are, for example, nickel (Ni), tungsten (W), molybdenum (Mo), gold (Au), silver (Ag), or copper (Cu).

The metal plugs 34 are formed, for example, by a CVD process, a sputtering process, or an electroless plating process. Thereafter, it is planarized by a CMP process, for example.

By the above pattern forming method, the minute metal plugs 34 can be formed.

The following describes the function and effect of the pattern forming method in this embodiment.

A polymer pattern formed by a DSA technique does not have sufficient dry etching resistance. Therefore, for dry etching processing with a polymer pattern formed by a DSA technique as a mask, there is a method of previously forming an oxide protective film selectively on the pattern. In this case, although dry etching resistance is provided, an additional step of forming a protective film is required, complicating the manufacturing process.

In this embodiment, the contact holes 32 are etched with the polymer pattern formed by the DSA technique as a mask. At this time, using the ALD process, the oxide layer 20 is selectively formed on one phase (the first phase 14a) of the phase-separated block copolymer, and the other phase (the second phase 14b) is selectively removed. That is, the formation of the oxide layer 20 to be a protective film and the polymer patterning are performed simultaneously by the ALD process.

Thus, complicated steps and high-cost steps for forming a protective film for a polymer pattern can be reduced. Thus, the manufacturing process can be simplified and reduced in cost. Accordingly, low-cost minute semiconductor devices and the like can be manufactured.

As above, according to this embodiment, a pattern forming method with a simple manufacturing process using a DSA technique can be provided.

EXAMPLES

Hereinafter, examples will be described.

Example 1

An example of the pattern forming method in the first embodiment will be described below.

An Si substrate (substrate) is irradiated with UV light for 5 minutes by a low-pressure mercury lamp to induce hydroxyl groups to the surface. The UV-treated Si substrate is spin-coated at a rotation speed of 2000 rpm with an ethyl lactate solution of poly(4-hydroxystyrene) with a hydroxyl group at one end (PHS—OH) (0.5 wt % concentration). Used PHS—OH has a molecular weight of Mn=50,000, and polydispersity of Mw/Mn=1.05.

After a solvent contained in a PHS—OH thin film is removed at 110° C. for 90 sec., annealing is performed at 150° C. for 8 h for cross-linking reaction between the hydroxyl groups on the Si substrate surface and PHS—OH. Subsequently, not-cross-linked excess PHS—OH is rinsed with ethyl lactate. An evaluation with an AFM of the thickness of the PHS thin film can determine that it is about 5 nm.

Next, an L & S guide pattern is created in the PHS thin film by photolithography. A spin-on glass (SOG) layer (thickness: 45 nm) is formed on the PHS thin film by spin coating at 1500 rpm for 30 sec. using SOG080 manufactured by JSR Corporation. Subsequently, spin coating with an ArF photoresist is performed at 1500 rpm for 35 sec., and a prebake is performed at 120° C. for 90 sec. The photoresist/SOG/PHS stacked film is subjected to L & S pattern exposure by an ArF excimer laser exposure apparatus. The amount of exposure is set at 25 mJ/cm$^2$, and the pattern pitch is set at 100 nm. After a post exposure bake (PEB) is performed at 125° C. for 60 sec., development is performed with 2.38% tetramethylammonium hydroxide (TMAH).

Thereafter, RIE is performed with $O_2$, and the SOG layer and the PHS thin film are subjected to RIE with a fluorine-based gas until the Si surface of the substrate appears. Then, residues of the photoresist, SOG, and others are removed with trimethyl(2-hydroxyethyl) ammonium hydroxide (TMY). An observation with an SEM of the formed pattern of the PHS thin film (first regions) shows that it is a line & space (L & S) pattern of a pitch of 100 nm.

The Si substrate processed to the L & S pattern is spin-coated at a rotation speed of 2000 rpm with an ethyl lactate solution of a poly(4-hydroxystyrene)-poly(methyl methacrylate) random copolymer with a hydroxyl group at one end (PHS-r-PMMA-OH) (0.5 wt % concentration). Used PHS-r-PMMA-OH has a molecular weight of Mn=50,000, polydispersity of Mw/Mn=1.05, and a volume fraction of $f_{PHS}$=0.5. After a solvent contained in a PHS-r-PMMA-OH thin film is removed at 110° C. for 90 sec., annealing is performed at 150° C. for 8 h for cross-linking reaction between the hydroxyl groups on the Si substrate surface and PHS-r-PMMA-OH.

Subsequently, not-cross-linked excess PHS-r-PMMA-OH is rinsed with ethyl lactate. Exposed Si surfaces are coated with the PHS-r-PMMA thin film (second regions) of a thickness of about 5 nm. An evaluation of the water contact angle of the PHS-r-PMMA thin film shows that it is a substantially middle value between the contact angle of the PHS thin film and the contact angle of PMMA.

Next, the top of the PHS-r-PMMA/PHS thin film on which the L & S pattern is formed is spin-coated at a rotation speed of 2000 rpm with an ethyl lactate solution of a poly(4-hydroxystyrene)-poly(methyl methacrylate) block copolymer (PHS-b-PMMA) (2 wt % concentration). Used PHS-b-PMMA has a molecular weight of Mn=122,000, polydispersity of Mw/Mn=1.08, and a volume fraction of $f_{PHS}$=0.5. After a solvent contained in a PHS-b-PMMA thin film (block copolymer layer) is removed at 110° C. for 90 sec., annealing is performed at 200° C. for 8 h to phase-separate PHS-b-PMMA into a PHS phase (first phase) and a PMMA phase (second phase). Subsequently, an observation with an AFM is performed for a pattern check. The performed AFM observation shows that an L & S pattern of a pitch of 50 nm is formed.

Subsequently, nickel film formation is selectively performed only on the PHS phase by ALD, and the PMMA phase is selectively removed. For a precursor for forming nickel, [Ni(acetylacetonate)$_2$], and $O_3$ and $H_2$ are used to perform film formation at a substrate temperature of 200° C.

PHS, which contains hydroxyl groups, reacts with [Ni(acetylacetonate)$_2$] so that a nickel film can be selectively formed only on the PHS phase. On the other hand, [Ni(acetylacetonate)$_2$] is not chemically adsorbed on PMMA, which is thus exposed to $O_3$ and decomposed.

An SEM observation of a cross-section of the PHS-b-PMMA film on which the nickel film is ALD-formed shows that the nickel film of a width of 25 nm and a height of 13 nm is selectively formed on the PHS phase, and the PMMA phase is removed.

Subsequently, an $SiO_2$ film is formed so that the nickel layer is not exposed at the surface. Next, CMP is performed for planarization until the nickel layer is exposed at the surface.

Example 2

Processing identical to that in Example 1 was performed except that materials for creating a guide pattern were changed from PHS—OH and PHS-r-PMMA-OH to poly(2-vinylpyridine) (P2VP—OH) and a polystyrene-poly(2-vinylpyridine) random copolymer (PS-r-P2VP—OH) terminated with a hydroxyl group, and a block copolymer material was changed from PHS-b-PMMA to a PS-P2VP block copolymer (PS-b-P2VP). P2VP—OH has a molecular weight of Mn=50,000 and polydispersity of Mw/Mn=1.05. PS-r-P2VP—OH has a molecular weight of Mn=50,000, polydispersity of Mw/Mn=1.05, and a volume fraction of $f_{PS}$=0.5. PS-b-P2VP has a molecular weight of Mn=122,000, polydispersity of Mw/Mn=1.08, and a volume fraction of $f_{PS}$=0.5.

An SEM observation of a cross-section of the PS-b-P2VP film on which a nickel film is ALD-formed shows that the nickel film of a width of 25 nm and a height of 13 nm is selectively formed on a P2VP phase, and a PS phase is removed.

Example 3

An example of the pattern forming method in the second embodiment will be described below.

An Si substrate (substrate) is irradiated with UV light for 5 minutes by a low-pressure mercury lamp to induce hydroxyl groups to the surface. The UV-treated Si substrate is spin-coated at a rotation speed of 2000 rpm with an ethyl lactate solution of poly(4-hydroxystyrene) with a hydroxyl group at one end (PHS—OH) (0.5 wt % concentration). Used PHS—OH has a molecular weight of Mn=50,000, and polydispersity of Mw/Mn=1.05.

After a solvent contained in a PHS—OH thin film is removed at 110° C. for 90 sec., annealing is performed at 150° C. for 8 h for cross-linking reaction between the hydroxyl groups on the Si substrate surface and PHS—OH. Subsequently, not-cross-linked excess PHS—OH is rinsed with ethyl lactate. An evaluation with an AFM of the thickness of the PHS thin film can determine that it is about 5 nm.

Next, an L & S guide pattern is created in the PHS thin film by photolithography. A spin-on glass (SOG) layer (thickness: 45 nm) is formed on the PHS thin film by spin coating at 1500 rpm for 30 sec. using SOG080 manufactured by JSR Corporation. Subsequently, spin coating with an ArF photoresist is performed at 1500 rpm for 35 sec., and a prebake is performed at 120° C. for 90 sec. The photoresist/SOG/PHS stacked film is subjected to L & S pattern exposure by an ArF excimer laser exposure apparatus. The amount of exposure is set at 25 mJ/cm$^2$, and the pattern pitch is set at 100 nm. After a post exposure bake (PEB) is performed at 125° C. for 60 sec., development is performed with 2.38% tetramethylammonium hydroxide (TMAH).

Thereafter, RIE is performed with O$_2$, and the SOG layer and the PHS thin film are subjected to RIE with a fluorine-based gas until the Si surface of the substrate appears. Then, residues of the photoresist, SOG, and others are removed with trimethyl(2-hydroxyethyl) ammonium hydroxide (TMY). An observation with an SEM of the formed pattern of the PHS thin film (first regions) shows that it is a line & space (L & S) pattern of a pitch of 100 nm.

The Si substrate processed to the L & S pattern is spin-coated at a rotation speed of 2000 rpm with an ethyl lactate solution of a poly(4-hydroxystyrene)-poly(methyl methacrylate) random copolymer with a hydroxyl group at one end (PHS-r-PMMA-OH) (0.5 wt % concentration). Used PHS-r-PMMA-OH has a molecular weight of Mn=50,000, polydispersity of Mw/Mn=1.05, and a volume fraction of $f_{PHS}$=0.5. After a solvent contained in a PHS-r-PMMA-OH thin film is removed at 110° C. for 90 sec., annealing is performed at 150° C. for 8 h for cross-linking reaction between the hydroxyl groups on the Si substrate surface and PHS-r-PMMA-OH.

Subsequently, not-cross-linked excess PHS-r-PMMA-OH is rinsed with ethyl lactate. Exposed Si surfaces are coated with a PHS-r-PMMA thin film (second regions) of a thickness of about 5 nm. An evaluation of the water contact angle of the PHS-r-PMMA thin film shows that it is a substantially middle value between the contact angle of the PHS thin film and the contact angle of PMMA.

Next, the top of the PHS-r-PMMA/PHS thin film on which the L & S pattern is formed is spin-coated at a rotation speed of 2000 rpm with an ethyl lactate solution of a poly(4-hydroxystyrene)-poly(methyl methacrylate) block copolymer (PHS-b-PMMA) (2 wt % concentration). Used PHS-b-PMMA has a molecular weight of Mn=122,000, polydispersity of Mw/Mn=1.08, and a volume fraction of $f_{PHS}$=0.5.

After a solvent contained in a PHS-b-PMMA thin film (block copolymer layer) is removed at 110° C. for 90 sec., annealing is performed at 200° C. for 8 h to phase-separate PHS-b-PMMA into a PHS phase (first phase) and a PMMA phase (second phase). Subsequently, an observation with an AFM is performed for a pattern check. The performed AFM observation shows that an L & S pattern of a pitch of 50 nm is formed.

Subsequently, SiO$_2$ film formation is selectively performed only on the PHS phase (first phase) by ALD, and the PMMA phase (second phase) is selectively removed. For a precursor for forming SiO$_2$, tris(dimethylamino) silane and O$_3$ are used to perform film formation at a substrate temperature of 150° C.

PHS, which contains hydroxyl groups, reacts with tris (dimethylamino) silane, so that an SiO$_2$ film can be selectively formed only on the PHS phase. On the other hand, tris(dimethylamino) silane is not chemically adsorbed on PMMA, which is thus exposed to O$_3$ and decomposed.

An SEM observation of a cross-section of the PHS-b-PMMA film on which the SiO$_2$ film is ALD-formed shows that the SiO$_2$ film of a width of 25 nm and a height of 13 nm is selectively formed on the PHS phase, and the PMMA phase is removed.

Subsequently, a tungsten film is formed so that the SiO$_2$ layer is not exposed at the surface. Next, CMP is performed for planarization until the SiO$_2$ layer is exposed at the surface.

Example 4

Processing identical to that in Example 3 was performed except that materials for creating a guide pattern were changed from PHS—OH and PHS-r-PMMA-OH to poly(2-vinylpyridine) (P2VP—OH) and a polystyrene-poly(2-vinylpyridine) random copolymer (PS-r-P2VP—OH) terminated with a hydroxyl group.

An SEM observation of a cross-section of a PHS-b-PMMA film on which an SiO$_2$ film is ALD-formed shows that an SiO$_2$ film of a width of 25 nm and a height of 13 nm is selectively formed on a PHS phase, and a PMMA phase is removed.

Example 5

An example of the pattern forming method in the third embodiment will be described below.

Using a semiconductor circuit substrate coated with SiO$_2$ at a topmost layer, it is irradiated with UV light for 5 minutes by a low-pressure mercury lamp to induce hydroxyl groups to an SiO$_2$ (substrate) surface. The UV-treated substrate is spin-coated at a rotation speed of 2000 rpm with an ethyl lactate solution of poly(4-hydroxystyrene) with a hydroxyl group at one end (PHS—OH) (0.5 wt % concentration). Used PHS—OH has a molecular weight of Mn=50,000, and polydispersity of Mw/Mn=1.05.

After a solvent contained in a PHS—OH thin film is removed at 110° C. for 90 sec., annealing is performed at 150° C. for 8 h for cross-linking reaction between the hydroxyl groups on the SiO$_2$ surface and PHS—OH. Subsequently, not-cross-linked excess PHS—OH is rinsed with ethyl lactate. An evaluation with an AFM of the thickness of the PHS thin film can determine that it is about 5 nm.

Next, an L & S guide pattern is created in the PHS thin film by photolithography. A spin-on glass (SOG) layer (thickness: 45 nm) is formed on the PHS thin film by spin coating at 1500 rpm for 30 sec. using SOG080 manufactured by JSR Corporation. Subsequently, spin coating with an ArF photoresist is performed at 1500 rpm for 35 sec., and a prebake is performed at 120° C. for 90 sec. The photoresist/SOG/PHS stacked film is subjected to L & S pattern exposure by an ArF excimer laser exposure apparatus. The amount of exposure is set at 25 mJ/cm², and the pattern pitch is set at 100 nm. After a post exposure bake (PEB) is performed at 125° C. for 60 sec., development is performed with 2.38% tetramethylammonium hydroxide (TMAH).

Thereafter, RIE is performed with $O_2$, and the SOG layer and the PHS thin film are subjected to RIE with a fluorine-based gas until the $SiO_2$ surface of the substrate appears. Then, residues of the photoresist, SOG, and others are removed with trimethyl(2-hydroxyethyl) ammonium hydroxide (TMY). An observation with an SEM of the formed pattern of the PHS thin film (first regions) shows that it is a line & space (L & S) pattern of a pitch of 100 nm.

The Si substrate processed to the L & S pattern is spin-coated at a rotation speed of 2000 rpm with an ethyl lactate solution of a poly(4-hydroxystyrene)-poly(methyl methacrylate) random copolymer with a hydroxyl group at one end (PHS-r-PMMA-OH) (0.5 wt % concentration). Used PHS-r-PMMA-OH has a molecular weight of Mn=50,000, polydispersity of Mw/Mn=1.05, and a volume fraction of $f_{PHS}$=0.5. After a solvent contained in a PHS-r-PMMA-OH thin film is removed at 110° C. for 90 sec., annealing is performed at 150° C. for 8 h for cross-linking reaction between the hydroxyl groups on the $SiO_2$ surface and PHS-r-PMMA-OH. Subsequently, not-cross-linked excess PHS-r-PMMA-OH is rinsed with ethyl lactate. Exposed $SiO_2$ surfaces are coated with a PHS-r-PMMA thin film (second regions) of a thickness of about 5 nm. An evaluation of the water contact angle of the PHS-r-PMMA thin film shows that it is a substantially middle value between the contact angle of the PHS thin film and the contact angle of PMMA.

Next, the top of the PHS-r-PMMA/PHS thin film on which the L & S pattern is formed is spin-coated at a rotation speed of 2000 rpm with an ethyl lactate solution of a poly(4-hydroxystyrene)-poly(methyl methacrylate) block copolymer (PHS-b-PMMA) (2 wt % concentration). Used PHS-b-PMMA has a molecular weight of Mn=122,000, polydispersity of Mw/Mn=1.08, and a volume fraction of $f_{PHS}$=0.5.

After a solvent contained in a PHS-b-PMMA thin film is removed at 110° C. for 90 sec., annealing is performed at 200° C. for 8 h to phase-separate PHS-b-PMMA into a PHS phase (first phase) and a PMMA phase (second phase). Subsequently, an observation with an AFM is performed for a pattern check. The performed AFM observation shows that an L & S pattern of a pitch of 50 nm is formed.

Subsequently, $SiO_2$ film formation is selectively performed only on the PHS phase (first phase) by ALD, and the PMMA phase (second phase) is selectively removed. For a precursor for forming $SiO_2$, tris(dimethylamino) silane and $O_3$ are used to perform film formation at a substrate temperature of 150° C.

PHS, which contains hydroxyl groups, reacts with tris (dimethylamino) silane, so that an $SiO_2$ film can be selectively formed only on the PHS phase. On the other hand, tris(dimethylamino) silane is not chemically adsorbed on PMMA, which is thus exposed to $O_3$ and decomposed.

An SEM observation of a cross-section of the PHS-b-PMMA film on which the $SiO_2$ film is ALD-formed shows that the $SiO_2$ film of a width of 25 nm and a height of 13 nm is selectively formed on the PHS phase, and the PMMA phase is removed.

After a transfer by RIE to the substrate is performed with this pattern as a mask, a remaining film on the $SiO_2$ film is removed with TMY. As a result, an uneven pattern in an L & S shape of a width of 25 nm and a depth of 10 nm formed by the $SiO_2$ film can be formed. A tungsten film is formed so that the $SiO_2$ layer is not exposed at the surface. Next, CMP is performed for planarization until the $SiO_2$ layer is exposed at the surface. Tungsten wiring of a width of 25 nm and a height of 10 nm can be formed.

Example 6

Processing identical to that in Example 5 was performed except that materials for creating a guide pattern were changed from PHS—OH and PHS-r-PMMA-OH to poly(2-vinylpyridine) (P2VP—OH) and a polystyrene-poly(2-vinylpyridine) random copolymer (PS-r-P2VP—OH) terminated with a hydroxyl group, and a block copolymer material was changed from PHS-b-PMMA to a PS-P2VP block copolymer (PS-b-P2VP). P2VP—OH has a molecular weight of Mn=50,000 and polydispersity of Mw/Mn=1.05. PS-r-P2VP—OH has a molecular weight of Mn=50,000, polydispersity of Mw/Mn=1.05, and a volume fraction of $f_{PS}$=0.5. PS-b-P2VP has a molecular weight of Mn=122,000, polydispersity of Mw/Mn=1.08, and a volume fraction of $f_{PHS}$=0.5.

An SEM observation of a cross-section of a PS-b-P2VP film on which an $SiO_2$ film is ALD-formed shows that the $SiO_2$ film of a width of 25 nm and a height of 13 nm is selectively formed on a P2VP phase, and a PS phase is removed. With this pattern as a mask, a transfer to the substrate by RIE is performed, and a remaining film on the $SiO_2$ film is removed with TMY. As a result, an uneven pattern in an L & S shape of a width of 25 nm and a depth of 10 nm formed by the $SiO_2$ film can be formed. A tungsten film is formed so that the $SiO_2$ layer is not exposed at the surface. Next, CMP is performed for planarization until the $SiO_2$ layer is exposed at the surface. Tungsten wiring of a width of 25 nm and a height of 10 nm can be formed.

Example 7

Processing identical to that in Example 1 is performed until an L & S pattern is formed with PHS-b-PMMA.

When a nickel film is subsequently formed by ALD, a precursor is changed to [Ni(acetylacetonate)$_2$] and hydrogen plasma, which is different from Example 1.

An SEM observation of a cross-section of a PHS-b-PMMA film on which the nickel film is ALD-formed shows that the nickel film of a width of 25 nm and a height of 13 nm is selectively formed on a PHS phase, and a PMMA phase is removed, as in Example 1.

Subsequently, an $SiO_2$ film is formed so that the nickel layer is not exposed at the surface. Next, CMP is performed for planarization until the nickel layer is exposed at the surface.

Example 8

Processing identical to that in Example 7 was performed except that materials for creating a guide pattern were changed from PHS—OH and PHS-r-PMMA-OH to poly(2-vinylpyridine) (P2VP—OH) and a polystyrene-poly(2-vinylpyridine) random copolymer (PS-r-P2VP—OH) terminated with a hydroxyl group, and a block copolymer material was changed from PHS-b-PMMA to a PS-P2VP block copolymer (PS-b-P2VP). P2VP—OH has a molecular weight of Mn=50,000 and polydispersity of Mw/Mn=1.05. PS-r-P2VP—OH has a molecular weight of Mn=50,000, polydispersity of Mw/Mn=1.05, and a volume fraction of $f_{PS}$=0.5. PS-b-P2VP has a molecular weight of Mn=122,000, polydispersity of Mw/Mn=1.08, and a volume fraction of $f_{PHS}$=0.5.

An SEM observation of a cross-section of a PS-b-P2VP film on which a nickel film is ALD-formed shows that the nickel film of a width of 25 nm and a height of 13 nm is selectively formed on a P2VP phase, and a PS phase is removed, as in Example 7. Subsequently, an SiO$_2$ film is formed so that the nickel layer is not exposed at the surface. Next, CMP is performed for planarization until the nickel layer is exposed at the surface.

Example 9

Processing identical to that in Example 3 is performed until an L & S pattern is formed with PHS-b-PMMA.

When an SiO$_2$ film is subsequently formed by ALD, a precursor is changed to tris(dimethylamino) silane and oxygen plasma, which is a difference.

An SEM observation of a cross-section of a PHS-b-PMMA film on which the SiO$_2$ film is ALD-formed shows that the SiO$_2$ film of a width of 25 nm and a height of 13 nm is selectively formed on the PHS phase, and the PMMA phase is removed, as in Example 3.

Subsequently, a tungsten film is formed so that the SiO$_2$ layer is not exposed at the surface. Next, CMP is performed for planarization until the SiO$_2$ layer is exposed at the surface.

Example 10

Processing identical to that in Example 9 was performed except that materials for creating a guide pattern were changed from PHS—OH and PHS-r-PMMA-OH to poly(2-vinylpyridine) (P2VP—OH) and a polystyrene-poly(2-vinylpyridine) random copolymer (PS-r-P2VP—OH) terminated with a hydroxyl group, and a block copolymer material was changed from PHS-b-PMMA to a PS-P2VP block copolymer (PS-b-P2VP). P2VP—OH has a molecular weight of Mn=50,000, and polydispersity of Mw/Mn=1.05. PS-r-P2VP—OH has a molecular weight of Mn=50,000, polydispersity of Mw/Mn=1.05, and a volume fraction of $f_{PS}$=0.5. PS-b-P2VP has a molecular weight of Mn=122,000, polydispersity of Mw/Mn=1.08, and a volume fraction of $f_{PHS}$=0.5.

An SEM observation of a cross-section of a PS-b-P2VP film on which an SiO$_2$ film is ALD-formed shows that the SiO$_2$ film of a width of 25 nm and a height of 13 nm is selectively formed on a P2VP phase, and a PS phase is removed, as in Example 9.

Example 11

An example of the pattern forming method in the fourth embodiment will be described below.

A contact and hole (C & H) pattern is formed on a semiconductor circuit substrate coated with SiO$_2$ at a topmost layer, for connection with metal wiring in a lower layer. First, a C & H pattern for a guide pattern is formed on the semiconductor circuit substrate by photolithography. Using CT08 manufactured by JSR Corporation, the top of the semiconductor circuit substrate is spin-coated with it at 1500 rpm for 30 seconds to form an SOC layer. Thereafter, using SOG080 manufactured by JSR Corporation, the top of the SOC is spin-coated with it at 1500 rpm for 30 seconds to form an SOG layer.

Subsequently, the top of the multi-layer film is spin-coated with a photoresist for ArF exposure (AR2395 manufactured by JSR Corporation) under the conditions of 1500 rpm, 30 seconds. After a prebake at 120° C. for 90 seconds, pattern exposure is performed using a reticle of a C & H pattern by an ArF excimer laser. The amount of exposure is set at 25 mJ/cm$^2$. PEB is performed at 125° C. for 60 seconds, and development is performed with 2.38% TMAH.

Subsequently, the photoresist after the development is exposed at the entire surface by the ArF excimer laser. The amount of exposure is set at 25 mJ/cm$^2$. Subsequently, the photoresist is cured by annealing at 185° C. for 120 seconds. The entire-surface exposure and annealing of the photoresist renders it insoluble in a block copolymer solution. In this manner, a C/H pattern (physical guide) of a photoresist of a film thickness of 125 nm and an opening diameter of 75 nm is obtained.

Next, by spin coating at a rotation speed of 2000 rpm with an ethyl lactate solution of a poly(4-hydroxystyrene)-poly (methyl methacrylate) block copolymer (PHS-b-PMMA) (2 wt % concentration), a PHS-b-PMMA thin film (block copolymer layer) is formed in the C & H guide pattern. Used PHS-b-PMMA has a molecular weight of Mn=122,000, polydispersity of Mw/Mn=1.08, and a volume fraction of $f_{PHS}$=0.75.

After a solvent contained in a PHS-b-PMMA thin film is removed at 110° C. for 90 sec., annealing is performed at 200° C. for 8 h to phase-separate PHS-b-PMMA into a PHS phase (first phase) and a PMMA phase (second phase). Subsequently, an observation with an AFM is performed for a pattern check. The performed AFM observation shows that the C & H pattern of a diameter of 25 nm is formed.

Subsequently, SiO$_2$ film formation is selectively performed only on the PHS phase and the photoresist by ALD, and the PMMA phase is selectively removed. For a precursor for forming SiO$_2$, tris(dimethylamino) silane and O$_3$ are used to perform film formation at a substrate temperature of 150° C.

PHS and the photoresist, which contain hydroxyl groups, react with tris(dimethylamino) silane, so that an SiO$_2$ film can be selectively formed only on the PHS phase and the photoresist. On the other hand, tris(dimethylamino) silane is not chemically adsorbed on PMMA, which is thus exposed to O$_3$ and decomposed.

An SEM observation of a cross-section of the PHS-b-PMMA film on which the SiO$_2$ film is ALD-formed shows that holes of a width of 25 nm and a height of 125 nm are formed above the wiring in the lower layer.

With this pattern as a mask, a transfer to the substrate is performed by RIE. As a result, a C & H pattern of a diameter of 25 nm can be formed in the SiO$_2$ film. A tungsten film is formed so that the SiO$_2$ layer is not exposed at the surface. Next, CMP is performed for planarization until the SiO$_2$ layer is exposed at the surface. Tungsten via wiring of a diameter of 25 nm can be formed. The tungsten via wiring is connected to the wiring in the lower layer.

Example 12

Processing identical to that in Example 11 was performed except that a block copolymer material was changed from PHS-b-PMMA to a PS-P2VP block copolymer (PS-b-P2VP). PS-b-P2VP has a molecular weight of Mn=122,000, polydispersity of Mw/Mn=1.08, and a volume fraction of $f_{PHS}$=0.75.

An SiO$_2$ film can be selectively formed only on a P2VP phase and a photoresist. On the other hand, tris(dimethylamino) silane is not chemically adsorbed on PS, which is thus exposed to $O_3$ and decomposed.

Therefore, it is found that holes of a width of 25 nm and a height of 125 nm can be formed above wiring in a lower layer as in Example 11.

With this pattern as a mask, a transfer to a substrate is performed by RIE. As a result, a C & H pattern of a diameter of 25 nm can be formed in the $SiO_2$ film. A tungsten film is formed so that the $SiO_2$ layer is not exposed at the surface. Next, CMP is performed for planarization until the $SiO_2$ layer is exposed at the surface. Tungsten via wiring of a diameter of 25 nm can be formed. The tungsten via wiring is connected to the wiring in the lower layer.

While certain embodiments have been described, these embodiments have been presented by way of example only, and are not intended to limit the scope of the inventions. Indeed, the pattern forming method described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A pattern forming method, comprising:
   forming a block copolymer layer on or above a substrate, the block copolymer layer containing a first polymer and a second polymer, the second polymer having lower surface energy than the first polymer;
   heat treating the block copolymer layer to separate the block copolymer layer into a first phase containing the first polymer and a second phase containing the second polymer; and
   selectively forming a metal layer on the first phase and selectively removing the second phase simultaneously using an atomic layer deposition process;
   wherein the atomic layer deposition process uses ozone and hydrogen.

2. The method according to claim 1, further comprising forming an insulator layer in a region from which the second phase is removed.

3. The method according to claim 1, wherein the first polymer contains, at a side chain, a functional group selected from the group of a hydroxyl group, a carboxyl group, an amino group, an amide group, an isocyanate group, and a pyridine ring, and the second polymer does not contain, at a side chain, a functional group selected from the group of a hydroxyl group, a carboxyl group, an amino group, an amide group, an isocyanate group, and a pyridine ring.

4. The method according to claim 1, wherein the block copolymer layer comprises one of the combinations of a polystyrene derivative and a polymethacrylate derivative, a polystyrene derivative and a polyacrylate derivative, a polymethacrylate derivative and a polyacrylate derivative, a polystyrene derivative and a polystyrene derivative, a polymethacrylate derivative and a polymethacrylate derivative, and a polyacrylate derivative and a polyacrylate derivative.

5. The method according to claim 1, further comprising forming a guide layer on the substrate before the forming the block copolymer layer, a first region extending in a first direction and a second region having lower surface energy than the first region and extending in the first direction being alternately arranged in the guide layer, wherein the block copolymer layer is formed on the guide layer, and
   the block copolymer layer is separated in such a manner that the first phase extending in the first direction and the second phase extending in the first direction are alternately arranged by the heat treating.

6. The method according to claim 1, further comprising forming a guide layer having an opening on the substrate before forming the block copolymer layer, wherein
   the block copolymer layer is formed in the opening, and
   the block copolymer layer is separated into the first phase and the second phase surrounded by the first phase by the heat treating.

7. The method according to claim 1, further comprising etching the substrate with the first phase as a mask.

8. A pattern forming method, comprising:
   forming a block copolymer layer on or above a substrate, the block copolymer layer containing a first polymer and a second polymer, the second polymer having lower surface energy than the first polymer;
   heat treating the block copolymer layer to separate the block copolymer layer into a first phase containing the first polymer and a second phase containing the second polymer; and
   selectively forming a metal layer on the first phase and selectively removing the second phase simultaneously using an atomic layer deposition process;
   wherein the atomic layer deposition process uses hydrogen plasma.

9. A pattern forming method comprising:
   forming a block copolymer layer on or above a substrate, the block copolymer layer containing a first polymer and a second polymer, the second polymer having lower surface energy than the first polymer;
   heat treating the block copolymer layer to separate the block copolymer layer into a first phase containing the first polymer and a second phase containing the second polymer; and
   selectively forming an oxide layer on the first phase and selectively removing the second phase simultaneously using an atomic layer deposition process;
   wherein the atomic layer deposition process uses ozone.

10. The method according to claim 9, further comprising forming a metal layer in a region from which the second phase is removed.

11. The method according to claim 9, wherein the first polymer contains, at a side chain, a functional group selected from the group of a hydroxyl group, a carboxyl group, an amino group, an amide group, an isocyanate group, and a pyridine ring, and the second polymer does not contain, at a side chain, a functional group selected from the group of a hydroxyl group, a carboxyl group, an amino group, an amide group, an isocyanate group, and a pyridine ring.

12. The method according to claim 9, wherein the block copolymer layer comprises one of the combinations of a polystyrene derivative and a polymethacrylate derivative, a polystyrene derivative and a polyacrylate derivative, a polymethacrylate derivative and a polyacrylate derivative, a polystyrene derivative and a polystyrene derivative, a polymethacrylate derivative and a polymethacrylate derivative, and a polyacrylate derivative and a polyacrylate derivative.

13. The method according to claim 9, further comprising forming a guide layer on the substrate before forming the block copolymer layer, a first region extending in a first direction and a second region having lower surface energy than the first region and extending in the first direction being alternately arranged in the guide layer, wherein the block copolymer layer is formed on the guide layer, and the block copolymer layer is separated in such a manner that the first phase extending in the first direction and the second phase extending in the first direction being alternately arranged by the heat treating.

14. The method according to claim 9, further comprising forming a guide layer having an opening on the substrate before forming the block copolymer layer, wherein the block copolymer layer is formed in the opening, and the block copolymer layer separated into the first phase and the second phase surrounded by the first phase by the heat treating.

15. The method according to claim 9, further comprising etching the substrate with the first phase as a mask.

16. A pattern forming method, comprising:

forming a block copolymer layer on or above a substrate, the block copolymer layer containing a first polymer and a second polymer, the second polymer having lower surface energy than the first polymer;

heat treating the block copolymer layer to separate the block copolymer layer into a first phase containing the first polymer and a second phase containing the second polymer; and selectively forming an oxide layer on the first phase and selectively removing the second phase simultaneously using an atomic layer deposition process;

wherein the atomic layer deposition process uses oxygen plasma.

\* \* \* \* \*